(12) United States Patent
Matsukawa

(10) Patent No.: US 10,474,531 B2
(45) Date of Patent: Nov. 12, 2019

(54) PROCESSING DEVICE

(71) Applicant: Fujitsu Optical Components Limited, Kawasaki-shi, Kanagawa (JP)

(72) Inventor: Daisuke Matsukawa, Kawasaki (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 15/868,048

(22) Filed: Jan. 11, 2018

(65) Prior Publication Data
US 2018/0196714 A1    Jul. 12, 2018

(30) Foreign Application Priority Data
Jan. 12, 2017    (JP) .................................. 2017-003602

(51) Int. Cl.
| | | |
|---|---|---|
| G06F 11/10 | (2006.01) | |
| G06F 11/00 | (2006.01) | |
| G11C 29/52 | (2006.01) | |

(52) U.S. Cl.
CPC ...... *G06F 11/1068* (2013.01); *G06F 11/1048* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 2002/0049931 A1 | 4/2002 | Goto | |
| 2005/0240801 A1* | 10/2005 | Johnson | G06F 11/106 714/5.11 |
| 2007/0101236 A1 | 5/2007 | Bauerle et al. | |
| 2014/0229766 A1* | 8/2014 | Campbell | G06F 11/106 714/15 |

FOREIGN PATENT DOCUMENTS

| | | |
|---|---|---|
| JP | 6-324952 | 11/1994 |
| JP | 2003-323353 | 11/2003 |

OTHER PUBLICATIONS

Japanese Patent Office English abstract for Japanese Patent Publication No. 6-324952, published Nov. 25, 1994.
Japanese Patent Office English abstract for Japanese Patent Publication No. 2003-323353, published Nov. 14, 2003.

* cited by examiner

*Primary Examiner* — Justin R Knapp
(74) *Attorney, Agent, or Firm* — Staas & Halsey LLP

(57) ABSTRACT

A processing device has a memory including a plurality of storage areas each storing a setting value and the correction frequency change unit. The correction frequency change unit is configured to decrease, when a frequency of correction by the error correction unit for a storage area that stores one of the setting values is changed to a high frequency, a frequency of correction by the error correction processing for one of the storage areas other than the storage area whose correction frequency is changed to a high frequency, and to increase, when a frequency of correction by the error correction unit for a storage area that stores one of the setting values is changed to a low frequency, a frequency of correction by the error correction processing for one of the storage areas other than the storage area whose correction frequency is changed to a low frequency.

4 Claims, 24 Drawing Sheets

FIG. 8

| FIRST FUNCTION PAIR | | |
|---|---|---|
| FUNCTION | EXTINCTION FUNCTION | LIGHT POWER CONTROL |
| STORAGE AREA | SIXTH STORAGE AREA 116 | SECOND STORAGE AREA 112 |
| SECOND FUNCTION PAIR | | |
| FUNCTION | STATE MONITORING | TEMPERATURE CONTROL |
| STORAGE AREA | THIRD STORAGE AREA 113 | FOURTH STORAGE AREA 114 |

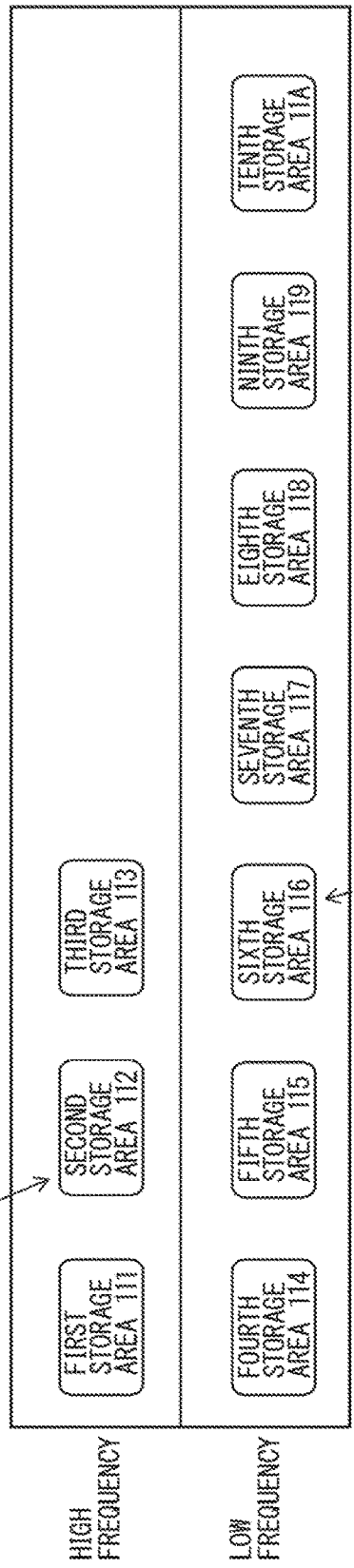
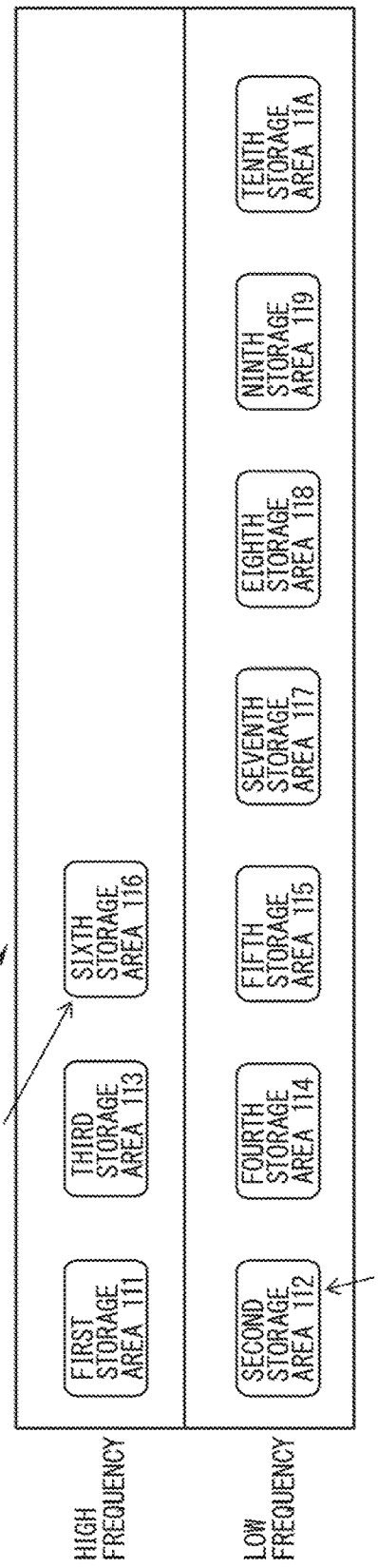

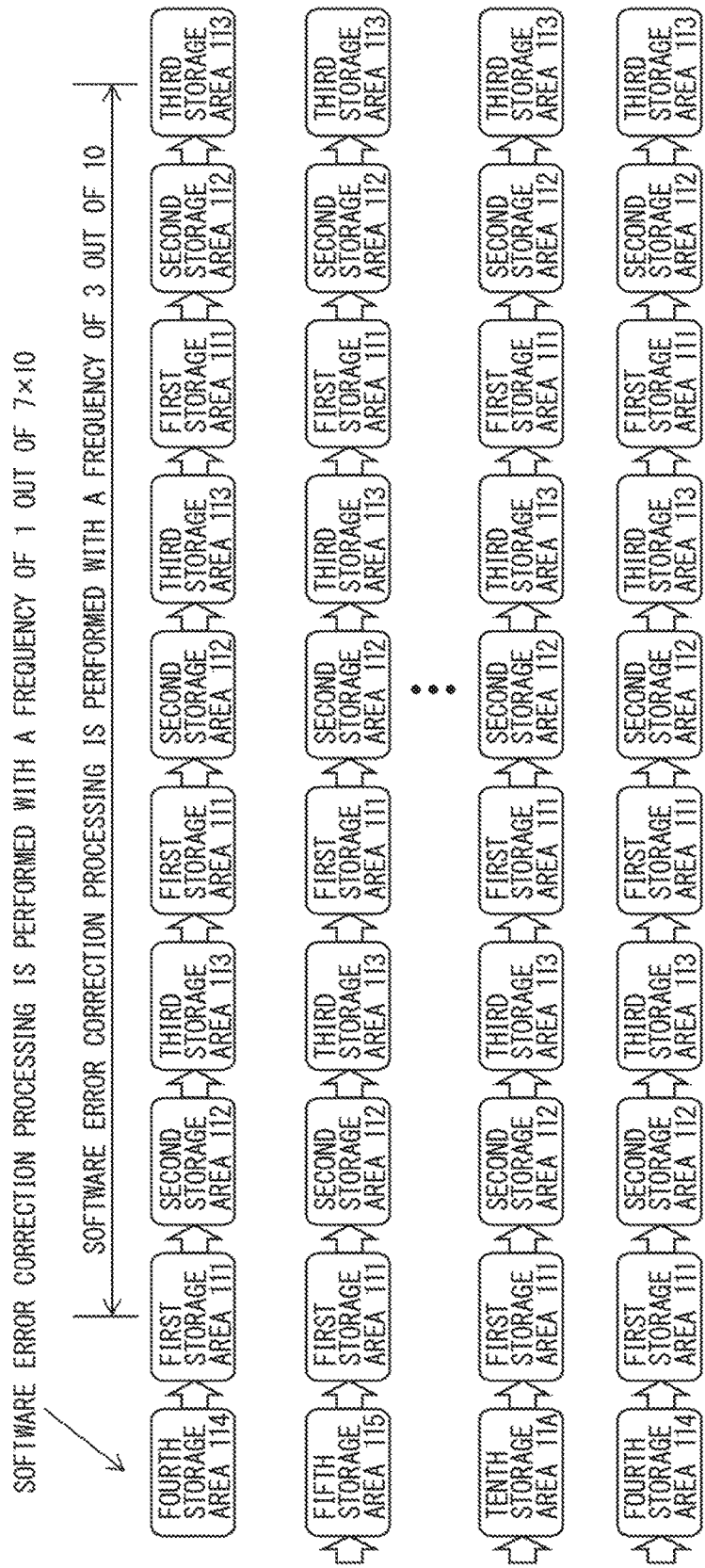

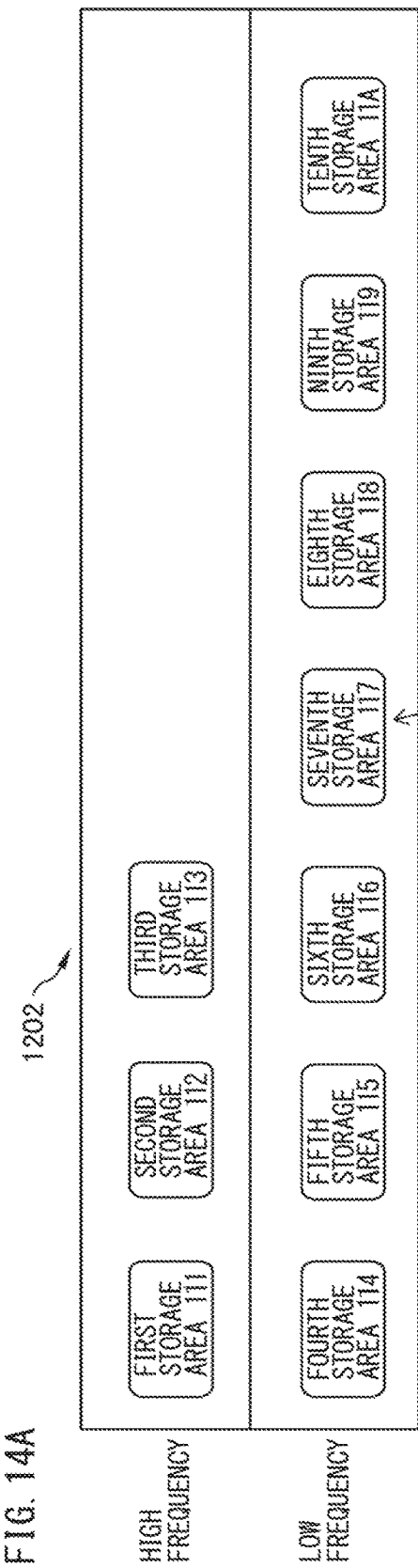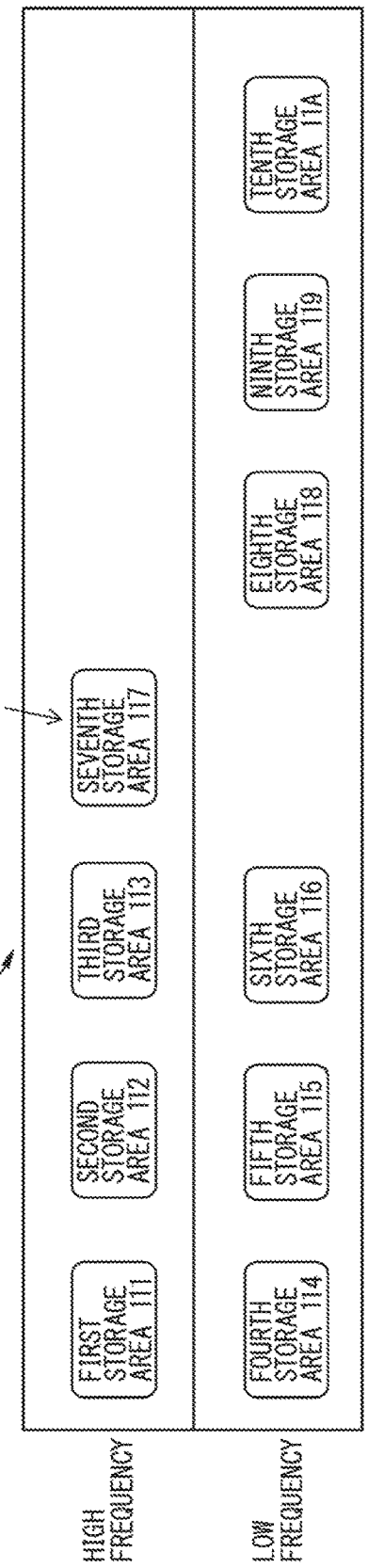

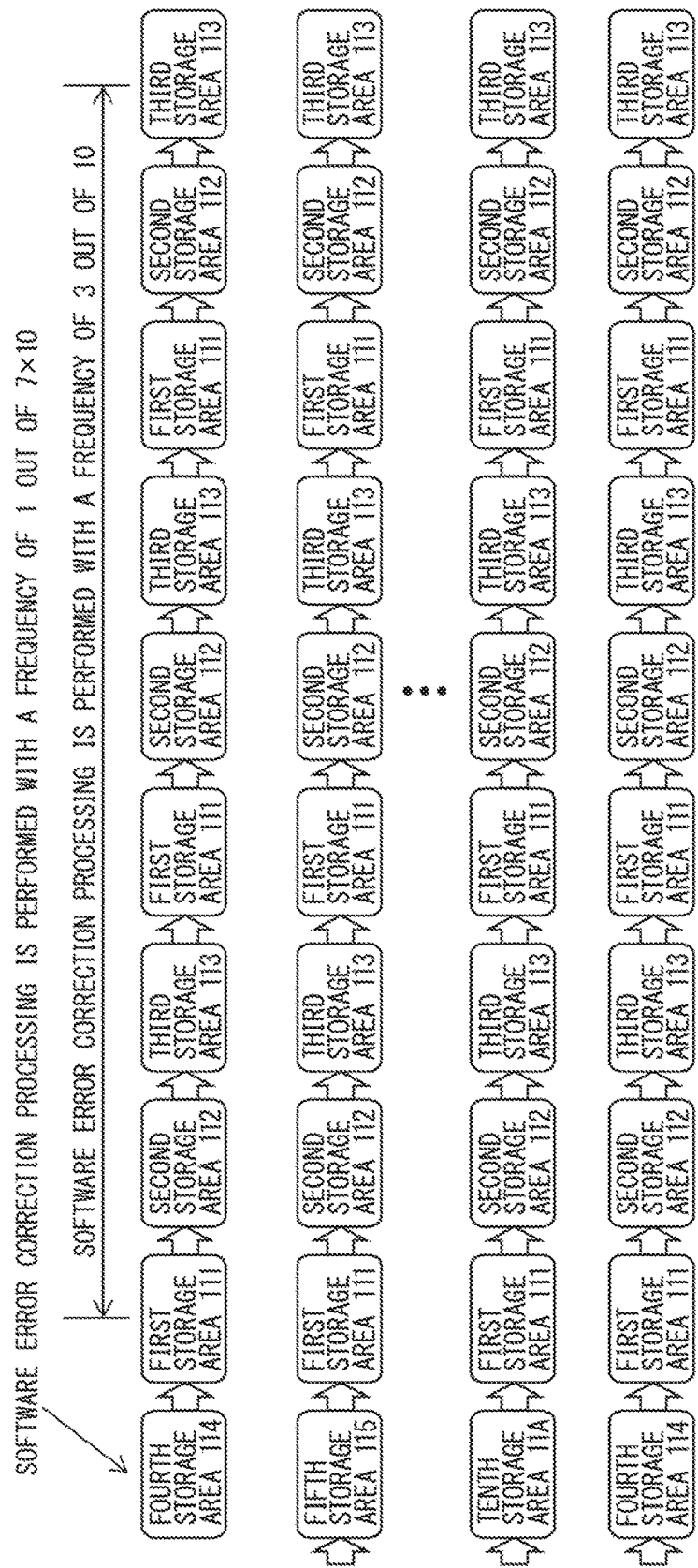

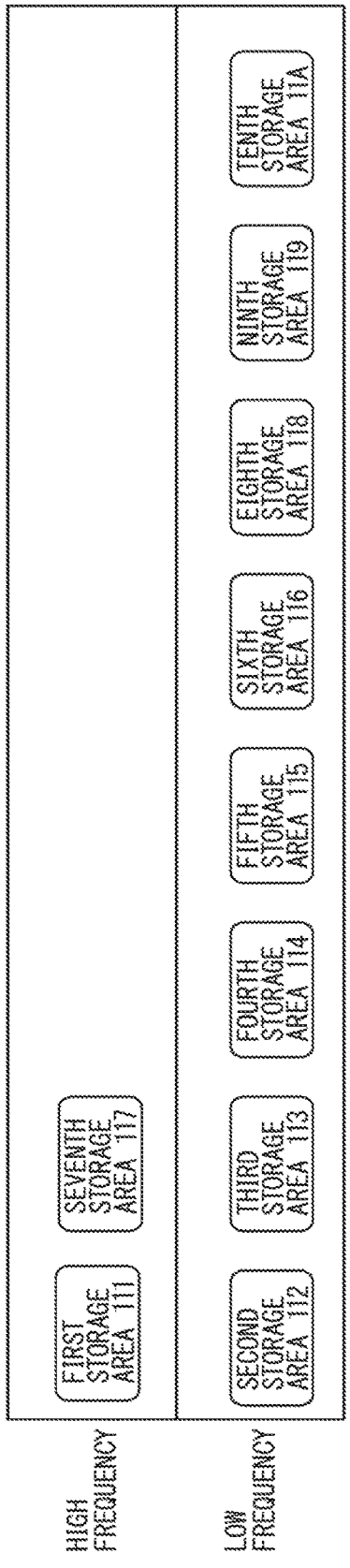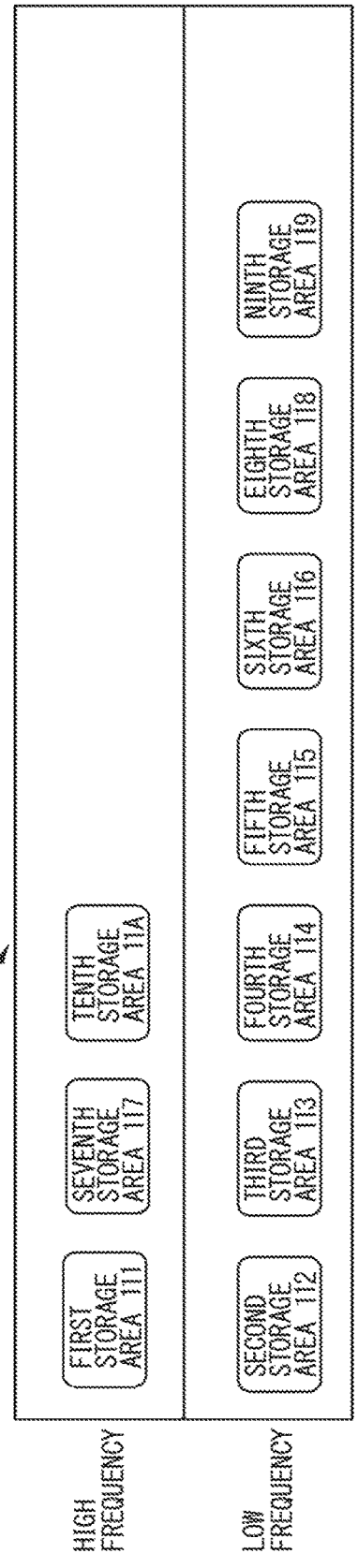

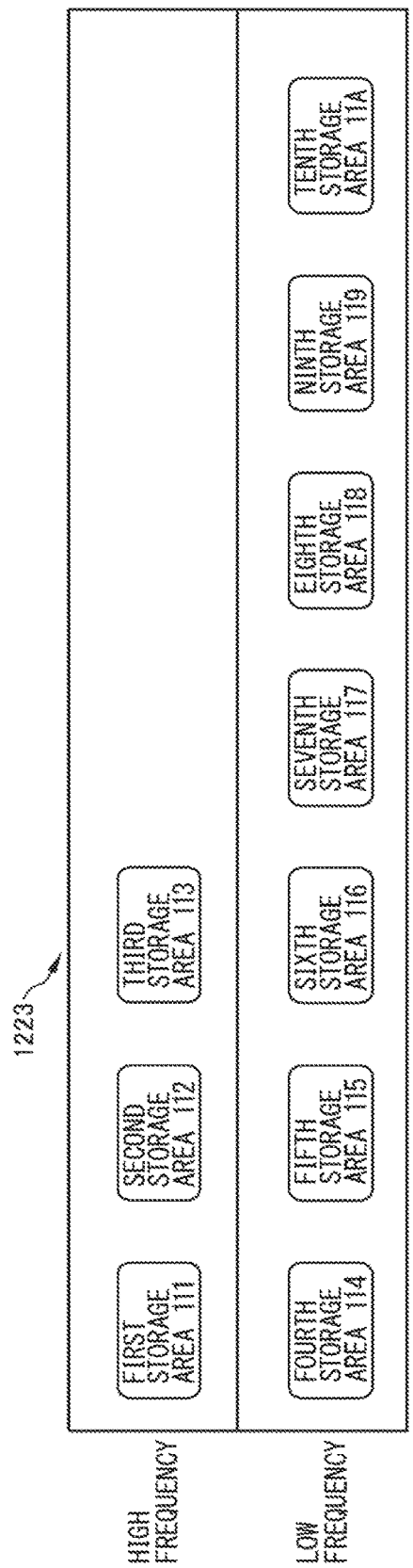

PROCESSING DEVICE

CROSS-REFERENCE TO RELATED APPLICATION

This application is based upon and claims the benefit of priority of the prior Japanese Patent Application No. 2017-003602, filed on Jan. 12, 2017, the entire contents of which area incorporated herein by reference.

FIELD

The present invention relates to a processing device.

BACKGROUND

It is known that error correction processing is performed for each of the plurality of areas with a predetermined frequency to correct an error of a setting value that is stored in a plurality of areas of a memory. Further, a technique is known to divide a memory into a plurality of memory areas and to set a frequency with which error correction processing of each setting value that is stored in a plurality of memory areas in accordance with a degree of importance of the stored setting value (for example, see Patent Documents 1 and 2). In the conventional technique, the frequency performing error correction processing is set at the time of shipment of a product.

RELATED DOCUMENTS

[Patent Document 1] Japanese Laid Open Patent Document No. 2003-323353

[Patent Document 2] Japanese Laid Open Patent Document No. H6-324952

SUMMARY

In one aspect, the processing device has a processor and a memory including a plurality of storage areas each storing a setting value for a plurality of functions. The processor performs predetermined processing by using each setting value. The processor further performs error correction processing to correct an error of each setting value that is stored in the memory and a correction frequency change processing to change a correction frequency with which error correction processing is performed in accordance with the processing that is performed by the processor. The processor performs a first correction frequency change process to decreases, when the frequency of correction by the error correction processing for the storage area that stores one setting value is changed to a high frequency, the frequency of correction by the error correction processing for one storage area other than the storage area whose correction frequency is changed to a high frequency so as to be lower than the correction frequency of the storage area whose correction frequency is changed to a high frequency and to increases, when the frequency of correction by the error correction processing for the storage area that stores one setting value is changed to a low frequency, the frequency of correction by the error correction processing for one storage area other than the storage area whose correction frequency is changed to a low frequency so as to be higher than the correction frequency of the storage area whose correction frequency is changed to a low frequency.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 8 is a diagram illustrating an example of the function pair table illustrated in FIG. 6;

FIG. 10A is a diagram illustrating the execution frequency information when the light power control unit is performing the light power control and the extinction function unit is keeping the extinction function in suspension;

FIG. 10B is a diagram illustrating execution frequency information when the light power control unit is keeping the light power control in suspension and the extinction function unit is performing the extinction function;

FIG. 11A is a diagram illustrating an example of the execution order of the software error correction processing when the light power control unit is performing the light power control and the extinction function unit is keeping the extinction function in suspension;

FIG. 14A is a diagram illustrating the execution frequency information when the warning function unit is keeping the warning function in suspension;

FIG. 14B is a diagram illustrating execution frequency information when the warning function unit is performing the warning function when temperature of the control device is risen and the like;

FIG. 15A is a diagram illustrating an example of the execution order of the software error correction processing when the warning function unit is keeping the warning function in suspension;

FIG. 20A is a diagram illustrating the first execution frequency information;

FIG. 20B is a diagram illustrating the second execution frequency information;

FIG. 20C is a diagram illustrating the third execution frequency information;

DESCRIPTION OF EMBODIMENTS

In the following, with reference to the drawings, a processing device according to embodiments is explained. However, the technical scope of the present invention is not limited to those embodiments.

(Control Device Installed in Processing Device Relating to Processing Device According to Embodiment)

Before explaining a processing device according to an embodiment, a control device installed in a processing device relating to a processing device according to the embodiment is explained.

Figure 1:
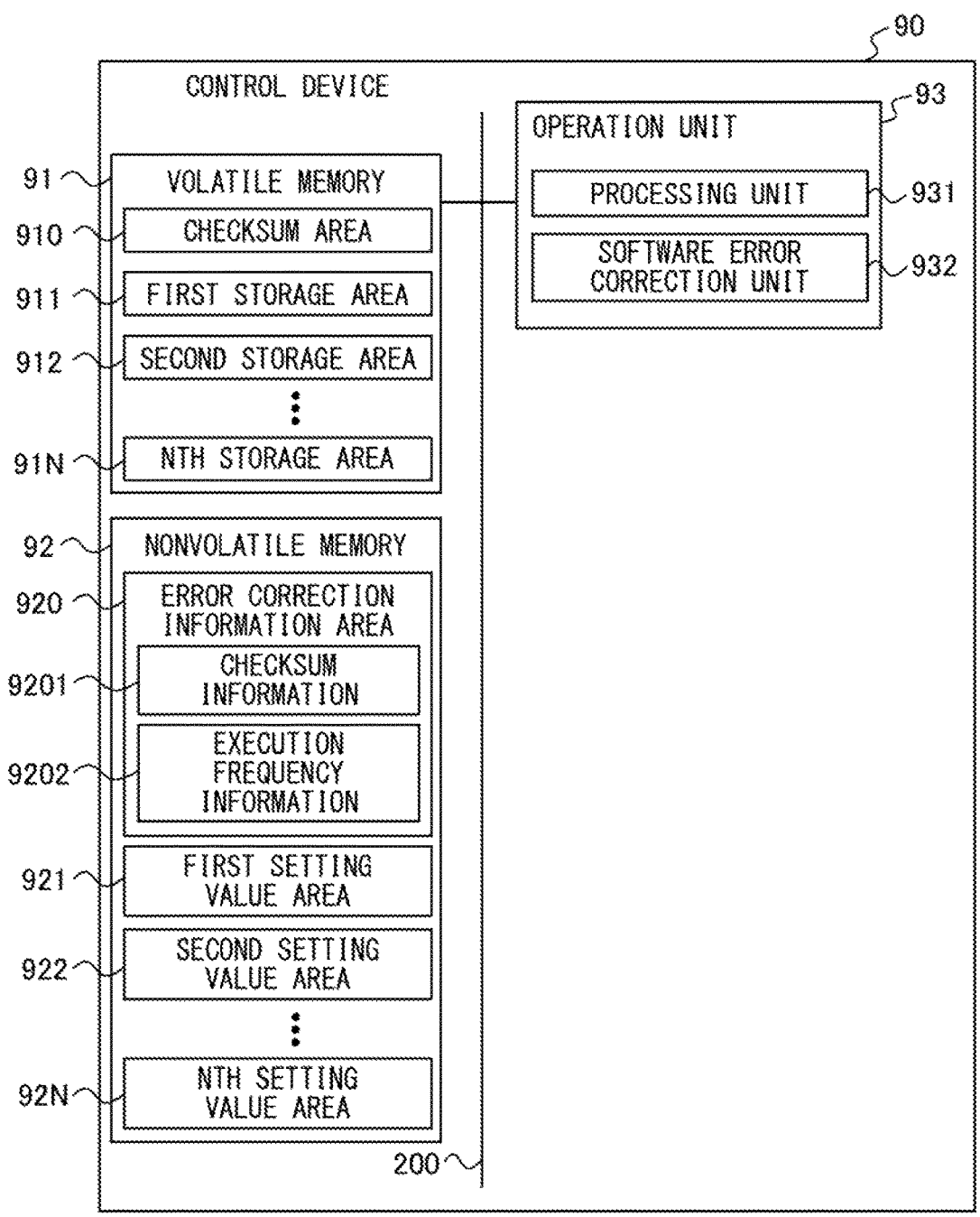
FIG. 1 is a block diagram of a control device installed in a processing device relating to the processing device according to the embodiment.

FIG. 1 is a block diagram of a control device installed in a processing device relating to the processing device according to the embodiment.

A control device 90 has a volatile memory 91, a nonvolatile memory 92, and an operation unit 93.

The volatile memory 91 is, in an example, an SRAM and has a checksum area 910 and a first storage area 911 to an Nth storage area 91N. The size of each of the first storage area 911 to the Nth storage area 911 is, in an example, 128 bytes. In the checksum area 910, a checksum obtained by totaling up, for each byte, data corresponding to the setting value that is stored in each of the first storage area 911 to the Nth storage area 91N is stored in association with each of the first storage area 911 to the Nth storage area 91N. A software error is not a bit error resulting from a hardware failure, but a bit error that occurs by the influence of cosmic rays and the like. In each of the first storage area 911 to the Nth storage area 91N, the setting value for each of N functions performed by the control unit 90 is stored.

The nonvolatile memory 92 is, in an example, a flash memory and in another example, an EEPROM and has an error correction information area 920 and a first setting value area 921 to an Nth setting value area 92N. In the error correction information area 920, checksum information 9201 including the original data of the checksum corresponding to each of the first storage area 911 to the Nth storage area 91N, which is stored in the checksum area 910, is stored. In the error correction information area 920, execution frequency information 9202 indicating an execution frequency with which software error correction processing is performed for the setting value that is stored in each of the first storage area 911 to the Nth storage area 91N is further stored. In each of the first setting value area 921 to the Nth setting value area 92N, the original data of the setting value that is stored in each of the first storage area 911 to the Nth storage area 91N of the volatile memory 91 is stored.

Figure 2:
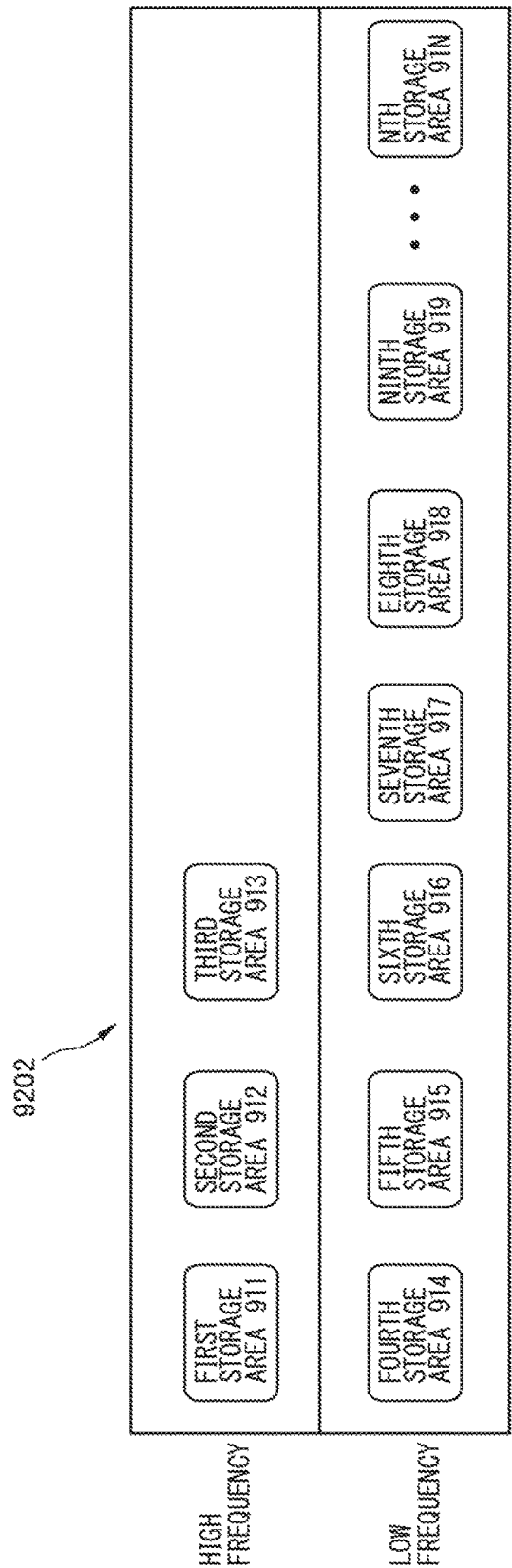
FIG. 2 is a diagram illustrating an example of the execution frequency information illustrated in FIG. 1.

FIG. 2 is a diagram illustrating an example of the execution frequency information 9202.

In the execution frequency information 9202, the first storage area 911 to the third storage area 913 are specified as areas in which the software error correction processing is performed with a high frequency and the fourth storage area 914 to the Nth storage area 91N are specified as areas in which the software error correction processing is performed with a low frequency. Whether the execution frequency of the software error correction processing, which is stored in the storage area, is a high frequency or a low frequency is determined at the time of shipment of the processing device in which the control device 90 is installed and the execution frequency is written to the nonvolatile memory 92 as the execution frequency information 9202.

The operation unit 93 has one or a plurality of processors and peripheral circuits thereof. The operation unit 93 centralizedly controls the entire operation of the control device 90 and is, for example, a CPU. The operation unit 93 performs processing to implement a predetermined function based on a setting value, etc., that is stored in the volatile memory 91. Further, the operation unit 93 may perform processing to implement functions for a plurality of setting values, etc., in parallel.

The operation unit 93 has a processing unit 931 and a software error correction unit 932. Each of these units is a function module implemented by a setting value that is stored in the volatile memory 91.

The processing unit 931 performs predetermined processing corresponding to the setting value that is stored in each of the first storage area 911 to the Nth storage area 91N by using the setting value that is stored in each of the first storage area 911 to the Nth storage area 91N of the volatile memory 91. Further, the processing unit 931 may perform processing to implement functions for a plurality of setting values in parallel.

The software error correction unit 932 detects whether a software error has occurred in the setting value that is stored in each of the first storage area 911 to the Nth storage area 91N and corrects the software error that has occurred when detecting that the software error has occurred in the setting value. The software error correction unit 932 performs the software error correction processing of the setting value that is stored in each of the first storage area 911 to the Nth storage area 91N based on the execution frequency specified in the error correction information area 920.

Figure 3:
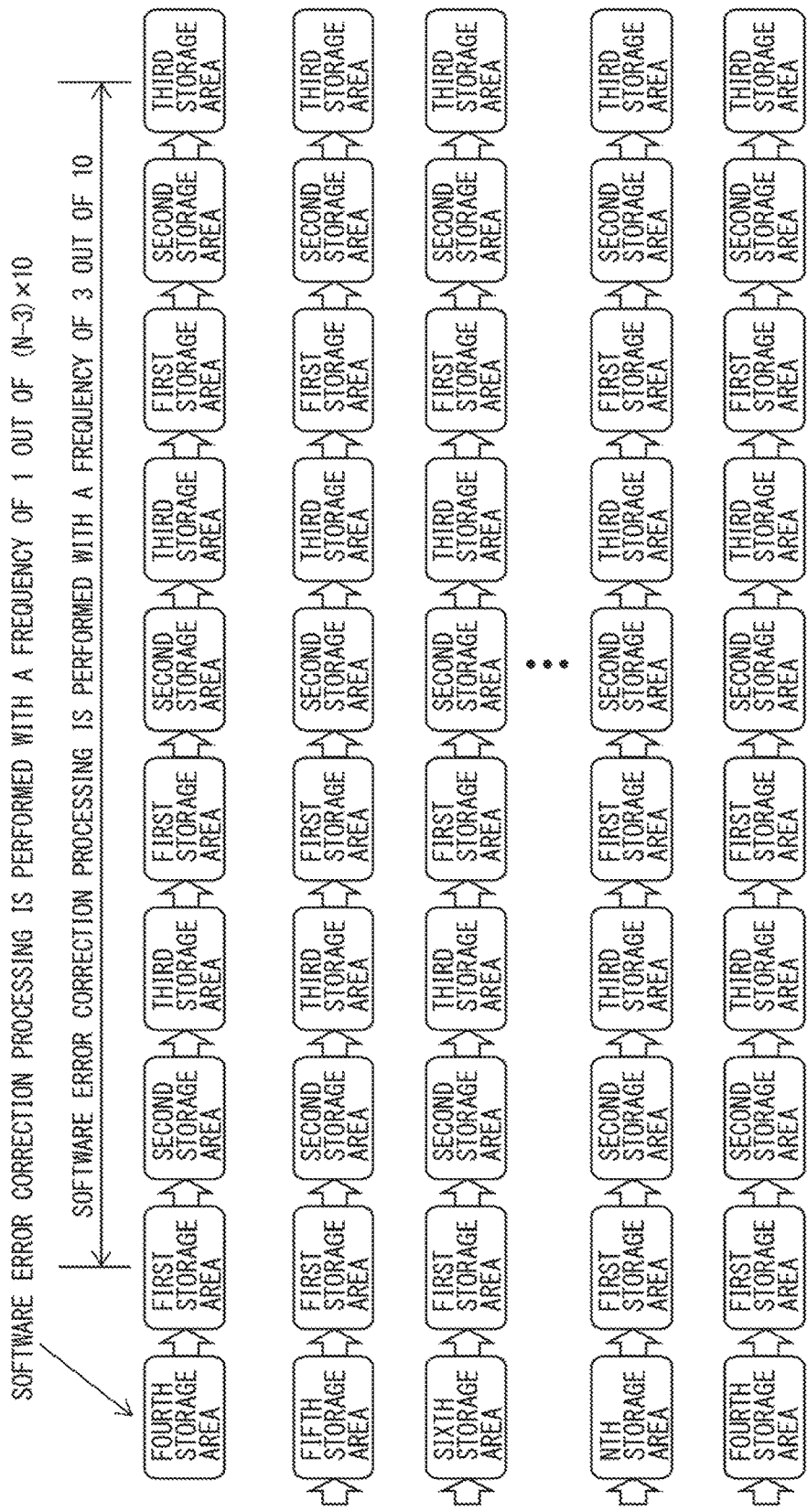
FIG. 3 is a diagram illustrating an example of the execution order of the software error correction processing of the setting value that is stored in each of the first storage area to the Nth storage area 91N by the software error correction unit illustrated in FIG. 1.

FIG. 3 is a diagram illustrating an example of the execution order of the software error correction processing of the setting value that is stored in each of the first storage area 911 to the Nth storage area 91N by the software error correction unit 932.

First, the software error correction unit 932 performs the software error correction processing of the setting value that is stored in the fourth storage area 914. Next, the software error correction unit 932 sequentially performs the software error correction processing of the setting value that is stored in each of the first storage area 911 to the third storage area 913 and repeats the processing three times. Next, after performing the software error correction processing of the setting value that is stored in the fifth storage area 915, the software error correction unit 932 sequentially performs the software error correction processing of the setting value that is stored in each of the first storage area 911 to the third storage area 913 and repeats the processing three times. After performing the software error correction processing of the setting value that is stored in each of the sixth storage area 916 to the Nth storage area 91N, the software error correction unit 932 performs the software error correction processing of the setting value that is stored in each of the first storage area 911 to the third storage area 913 and repeats the processing three times.

The software error correction unit 932 performs the software error correction processing of the first storage area 911 to the third storage area 913 specified as areas in which the software error correction processing is performed with a high frequency in the error correction information area 920 with a frequency of 3 out of 10, in other words, a frequency of 1 out of 3.3. On the other hand, the software error correction unit 932 performs the software error correction processing of the fourth storage area 914 to the Nth storage area 91N specified as areas in which the software error correction processing is performed with a low frequency in the error correction information area 920 with a frequency of 1 out of (N−3)×10.

(Software Error Correction Processing by Control Device Installed in Processing Device Relating to Processing Device According to Embodiment)

Figure 4:
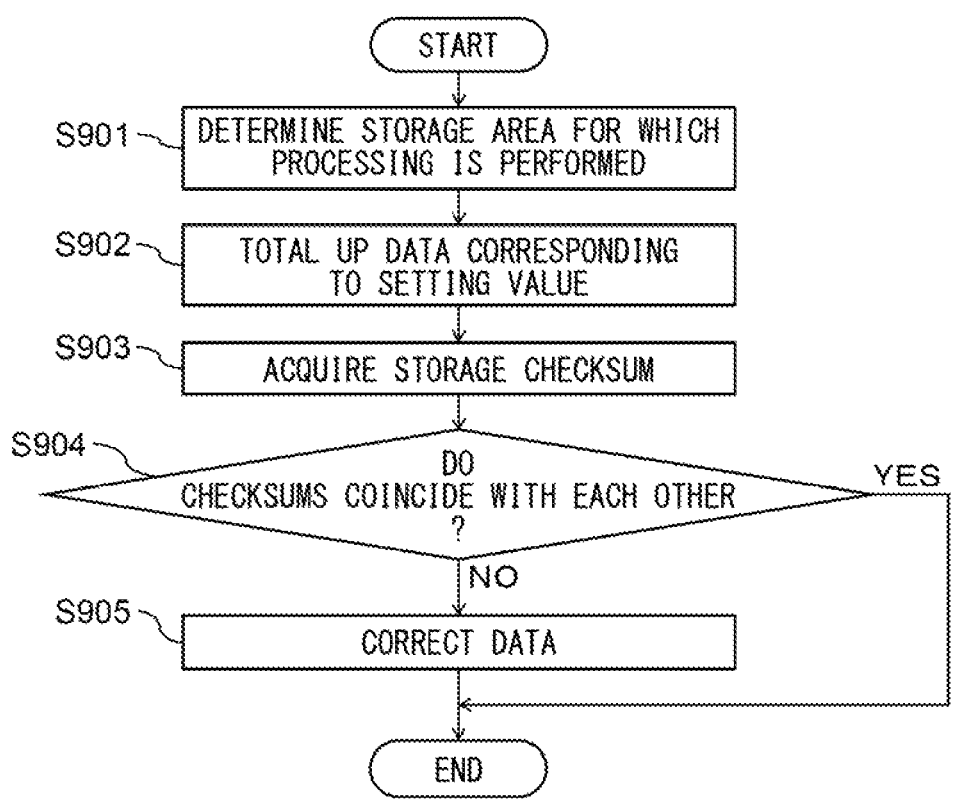
FIG. 4 is a flowchart of software error correction processing by the software error correction unit illustrated in FIG. 1.

FIG. 4 is a flowchart of software error correction processing by the software error correction unit 932. The software error correction processing illustrated in FIG. 4 is performed mainly by the operation unit 93 in cooperation with each element of the control device 90 based on programs stored in advance in the nonvolatile memory 92. The processing illustrated in FIG. 4 is performed every predetermined set time in the operation unit 93.

First, the software error correction unit 932 refers to the error correction information area 920 and determines a storage area for which the software error correction processing is performed (S901). Next, the software error correction unit 932 totals up, for each byte, data corresponding to the setting value that is stored in the storage area determined by the processing at S901 and calculates a checksum corresponding to the setting value that is stored in the storage area determined by the processing at S901 (S902). Next, the software error correction unit 932 acquires the checksum stored in association with the storage area determined by the processing at S901 from the checksum area 910 (S903). Next, the software error correction unit 932 determines whether the checksum calculated by the processing at S902 equals to the checksum acquired by the processing at S903 (S904). When the software error correction unit 932 determines that the checksum calculated by the processing at S902 equals to the checksum acquired by the processing at S903 (S904—YES), the software error correction unit 932 terminates the processing. On the other hand, When the software error correction unit 932 determines that the checksum calculated by the processing at S902 does not equal to the checksum acquired by the processing at S903 (S904—NO), the software error correction unit 932 corrects the data corresponding to the setting value that is stored in the target storage area (S905). The software error correction unit 932 corrects the data corresponding to the setting value that is stored in the target storage area by acquiring the setting value that is stored in the corresponding setting value area of the nonvolatile memory 92 and rewriting the setting value that is stored in the storage area to the acquired setting value.

The control device 90 determines the execution frequency of the software error correction processing for each storage area at the time of shipment of the processing device that is installed and performs the software error correction processing with the execution frequency determined at the time of shipment of the processing device. The control device 90 performs the software error correction processing with the execution frequency determined at the time of shipment of the processing device, and therefore even if the state of the processing device changes because external circumstances change due to abnormality of a signal, a change in temperature, and so on, during the operation of the processing device, the frequency with which the software error correction processing is performed does not change. The control device 90 does not change the frequency with which the software error correction processing is performed even if the state of the processing device changes, and therefore the software error correction processing is not performed with a sufficient frequency for the storage area in which the degree of importance of the setting value that is stored becomes high due to a change in the state of the processing device.

(Configuration and Function of Processing Device According to First Embodiment)

Figure 5:
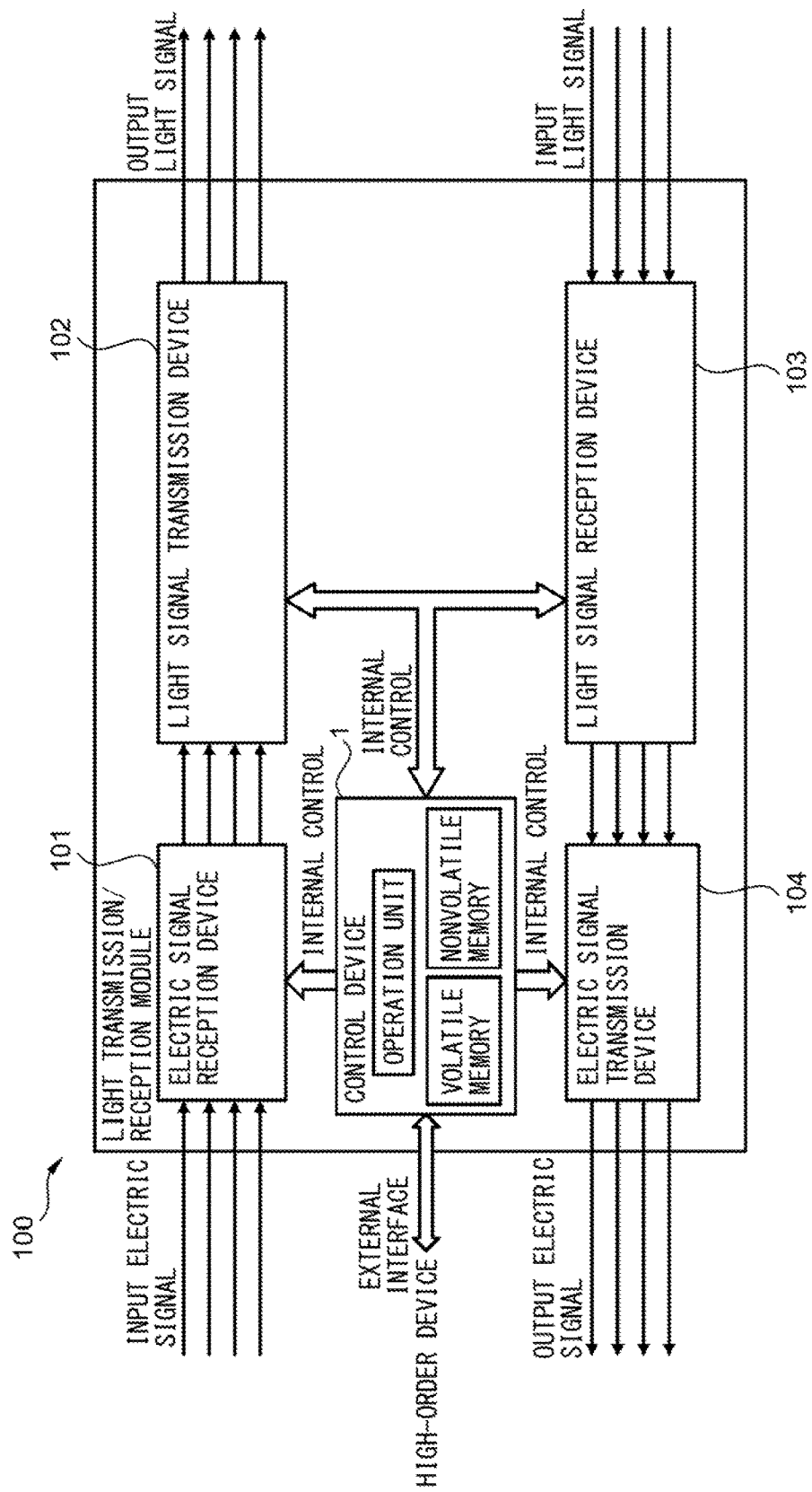
FIG. 5 is a block diagram of a control device according to a first embodiment.

FIG. 5 is a block diagram of a control device according to a first embodiment. A light transmission/reception module is an example of the processing device according to the embodiment.

A light transmission/reception module 100 has an electric signal reception device 101, a light signal transmission device 102, a light signal reception device 103, an electric signal transmission device 104, and a control device 1.

The electric signal reception device 101 receives an input electric signal from a high-order device, not illustrated schematically, which is connected with a light network, and generates an electric signal by shaping the waveform of the received input electric signal by an incorporated clock data recovery (CDR) circuit, not illustrated schematically. The electric signal reception device 101 outputs the generated electric signal to the light signal transmission device 102. The light signal transmission device 102 converts the electric signal input from the electric signal reception device 101 into a light signal to generate an output light signal and outputs the generated output light signal to a low-order device, not illustrated schematically.

The light signal reception device 103 converts an input light signal input from the low-order device, not illustrated schematically, into an electric signal and outputs the converted electric signal to the electric signal transmission device 104. The electric signal transmission device 104 generates an output electric signal by shaping the waveform of an electric signal input from the electric signal transmission device 104 by the incorporated CDR circuit, not illustrated schematically, and transmits the generated output electric signal to the high-order device, not illustrated schematically.

The control device 1 performs various kinds of processing in order to control the electric signal reception device 101, the light signal transmission device 102, the light signal reception device 103, and the electric signal transmission device 104. Further, the control device 1 decreases, when the frequency of correction by the error correction unit for the storage area that stores one setting value is changed to a high frequency, the frequency of correction by the error correction processing for one storage area other than the storage area whose correction frequency is changed to a high frequency so as to be lower than the correction frequency of the storage area whose correction frequency is changed to a high frequency. In addition, the control device 1 increases, when the frequency of correction by the error correction unit for the storage area that stores one setting value is changed to a low frequency, the frequency of correction by the error correction processing for one storage area other than the storage area whose correction frequency is changed to a low frequency so as to be higher than the correction frequency of the storage area whose correction frequency is changed to a low frequency.

Figure 6:
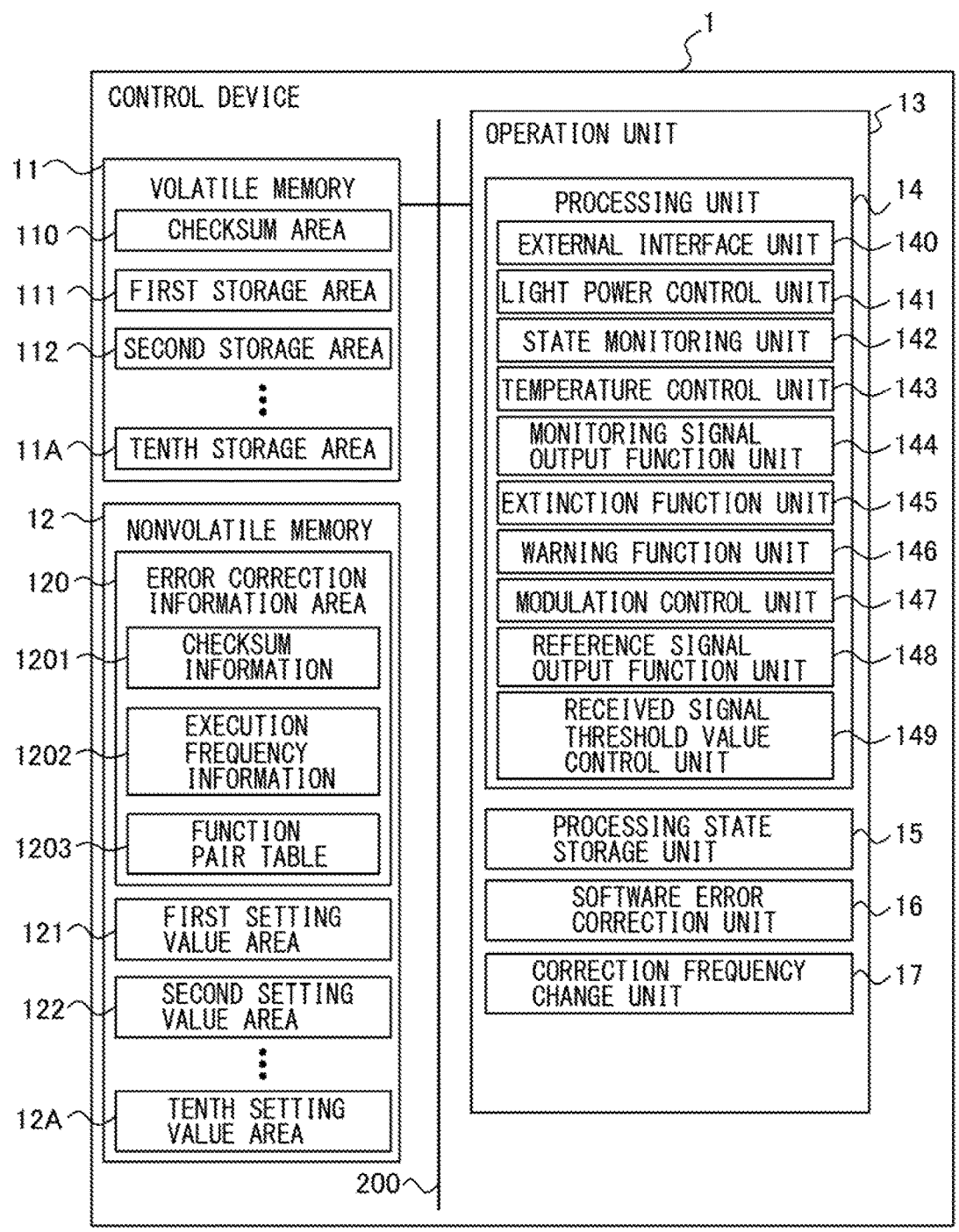
FIG. 6 is a block diagram of the control device illustrated in FIG. 5.

FIG. 6 is a block diagram of the control device 1.

The control device 1 has a volatile memory 11, a nonvolatile memory 12, and an operation unit 13. The operation unit 13 has a processing unit 14 configured to perform predetermined processing, a processing state storage unit 15 configured to store the processing being performed by the processing unit 14, a software error correction unit 16 configured to perform software error correction processing, and a correction frequency change unit 17 configured to change a frequency with which the software error correction processing is performed.

The volatile memory 11 is, in an example, an SRAM and has a checksum area 110 and ten storage areas which includes a first storage area 111 to a tenth storage area 11A. The size of each of the first storage area 111 to the tenth storage area 11A is, in an example, 128 bytes. In the checksum area 110, a checksum obtained by totaling up, for each byte, data corresponding to the setting value that is stored in each of the first storage area 111 to the tenth storage area 11A is stored in association with each of the first storage area 111 to the tenth storage area 11A. In each of the first storage area 111 to the tenth storage area 11A, the setting value for each of ten functions performed by the control device 1 is stored.

The nonvolatile memory 12 is, in an example, a flash memory and in another example, an EEPROM and has an error correction information area 120 and ten setting value areas which includes a first setting value area 121 to a tenth setting value area 12A. The error correction information area 120 stores checksum information 1201, execution frequency information 1202, and a function pair table 1203. The checksum information 1201 includes the original data of the checksum corresponding to each of the first storage area 111 to the tenth storage area 11A, which is stored in the checksum area 110. The execution frequency information 1202 indicates an execution frequency with which the software error correction processing is performed for the setting value that is stored in each of the first storage area 111 to the tenth storage area 11A.

Figure 7:
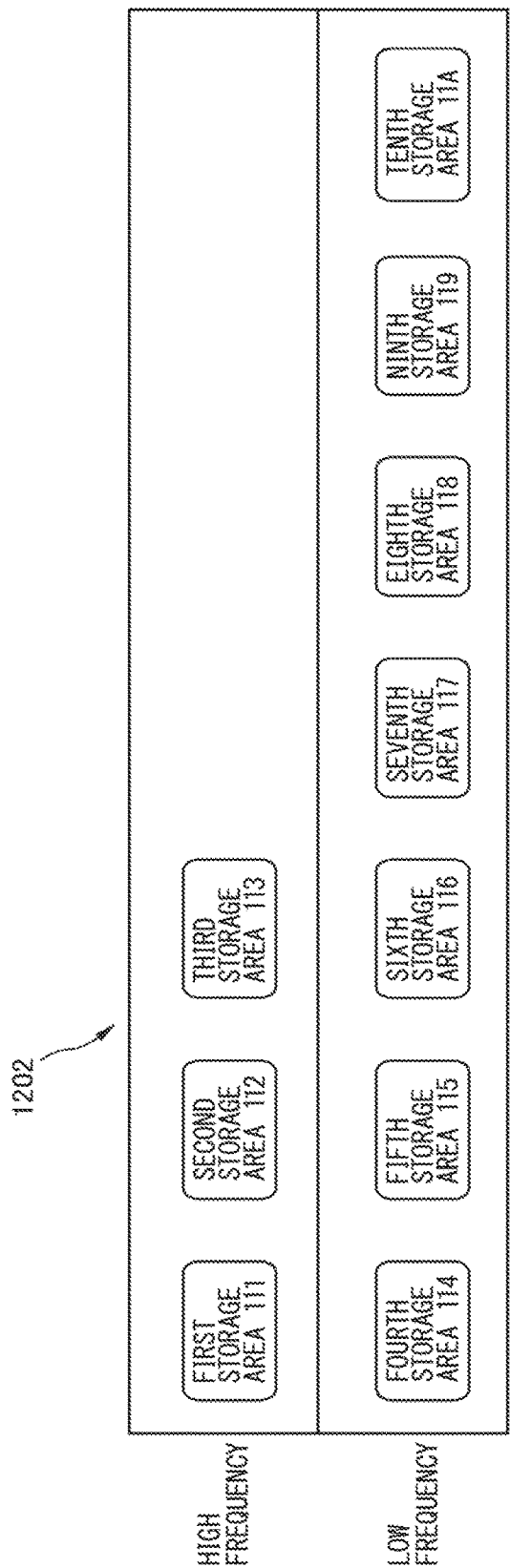
FIG. 7 is a diagram illustrating an example of the execution frequency information illustrated in FIG. 6.

FIG. 7 is a diagram illustrating an example of the execution frequency information 1202.

In the execution frequency information 1202, the first storage area 111 to the third storage area 113 are specified as areas in which the software error correction processing is performed with a high frequency and the fourth storage area 114 to the tenth storage area 11A are specified as areas in which the software error correction processing is performed with a low frequency. Whether the execution frequency of the software error correction processing, which is stored in the execution frequency information 1202, is a high frequency or a low frequency can be changed in accordance with the processing that is performed by the processing unit 14. Specifically, the execution frequency of the software error correction processing, which is stored in the execution frequency information 1202, is changed when processing corresponding to one of a pair of pieces of processing stored in the function pair table 1203 is performed.

FIG. 8 is a diagram illustrating an example of the function pair table 1203.

The function pair table 1203 stores an extinction function performed by the setting value that is stored in the sixth storage area 116 and light power control performed by the setting value that is stored in the second storage area 112 as a first function pair. Further, the function pair table 1203 stores state monitoring performed by the setting value that is stored in the third storage area 113 and temperature control performed by the setting value that is stored in the fourth storage area 114 as a second function pair.

When one of the extinction function and the light power control stored in the function pair table 1203 as the first function pair is performed, the other function is suspended. Similarly, when one of the state monitoring and the temperature control stored in the function pair table 1203 as the second function pair is performed, the other function is suspended.

In each of the first setting value area 121 to the tenth setting area 12A, the original data of the setting value that is stored in each of the first storage area 111 to the tenth storage area 11A of the volatile memory 11 is stored.

The operation unit 13 has one or a plurality of processors and peripheral circuits thereof. The operation unit 13 centralizedly controls the entire operation of the control device 1 and is, for example, a CPU. The operation unit 13 performs processing to implement a predetermined function based on the setting value that is stored in each of the first storage area 111 to the tenth storage area 11A of the volatile memory 11. Further, the operation unit 13 may perform processing to implement functions for a plurality of setting values in parallel.

The processing unit 14 has an external interface unit 140, a light power control unit 141, a state monitoring unit 142, a temperature control unit 143, and a monitoring signal output function unit 144. The processing unit 14 further has an extinction function unit 145, a warning function unit 146, a modulation control unit 147, a reference signal output function unit 148, and a received signal threshold value control unit 149. Each of these units, the processing state storage unit 15, the software error correction unit 16, and the correction frequency change unit 17 are each a function module implemented by the setting value that is stored in the volatile memory 11. The external interface unit 140 is implemented by the setting value that is stored in the first storage area 111, the light power control unit 141 is implemented by the setting value that is stored in the second storage area 112, and the state monitoring unit 142 is implemented by the setting value that is stored in the third storage area 113. The temperature control unit 143 is implemented by the setting value that is stored in the fourth storage area 114, the monitoring signal output function unit 144 is implemented by the setting value that is stored in the fifth storage area 115, and the extinction function unit 145 is implemented by the setting value that is stored in the sixth storage area 116. The warning function unit 146 is implemented by the setting value that is stored in the seventh storage area 117, the modulation control unit 147 is implemented by the setting value that is stored in the eighth storage area 118, and the reference signal output function unit 148 is implemented by the setting value that is stored in the ninth storage area 119. The received signal threshold value control unit 149 is implemented by the setting value that is stored in the tenth storage area 11A.

The external interface unit 140 performs communication processing to transmit and receive various settings/information with the high-order device, not illustrated schematically, based on the communication standard, such as MDIO. The light power control unit 141 controls the light power when the light signal transmission device 102 outputs an output light signal. For example, the light power control unit 141 controls a laser diode so that the light power when the output light signal is output becomes constant. The state monitoring unit 142 monitors the various states of the light transmission/reception module 100. The state monitoring unit 142 is connected to a temperature sensor, not illustrated schematically, and monitors the temperature of various elements that are installed in the light transmission/reception module 100, such as a laser diode that is used when the light signal transmission device 102 outputs an output light signal. Further, the state monitoring unit 142 is connected with a photodiode and a TAP photodiode, not illustrated schematically, and monitors the light intensity of an output light signal that is output by the light signal transmission device 102 and the light intensity of an input light signal that is input to the light signal reception device 103.

The temperature control unit 143 controls the waveform of an electric signal that is generated by controlling the operation of the CDR circuit and the like of the electric signal reception device 101 and the electric signal transmission device 104 in accordance with the temperature acquired from the temperature sensor by the state monitoring unit 142. The monitoring signal output function unit 144 outputs an input electric signal received from the high-order device, not illustrated schematically, and timing information on a clock of an output electric signal that is transmitted to the high-order device to the high-order device via the external interface unit 140.

The extinction function unit 145 suspends part or all of the operations of the electric signal reception device 101, the light signal transmission device 102, the light signal reception device 103, and the electric signal transmission device 104 in accordance with the state of a signal that is input to the light transmission/reception module 100. The extinction function unit 145 suspends part or all of the operations of the electric signal reception device 101 and the light signal transmission device 102 when an input electric signal is not transmitted to the electric signal reception device 101 from the high-order device. Further, the extinction function unit 145 suspends part or all of the operations of the light signal reception device 103 and the electric signal transmission device 104 when an input light signal is not transmitted to the light signal reception device 103 from the high-order device.

The warning function unit 146 detects an abnormal rise in temperature, and an abnormal rise and an abnormal fall in light power when the light signal transmission device 102 outputs an output light signal, and outputs warning information indicating the detected abnormality to the high-order device via the external interface unit 140. The modulation control unit 147 controls modulation processing when the light signal transmission device 102 generates a light signal.

The reference signal output function unit 148 generates a transmission test pattern, such as a pseudo random bit sequence (PRBS), at the time of activation of the light transmission/reception module 100. The reference signal output function unit 148 outputs the generated transmission test pattern to the light signal transmission device 102 and the light signal transmission device 102 transmits the input transmission pattern to the low-order device. The received signal threshold value control unit 149 controls the threshold value when the electric signal transmission device 104 determines the signal value corresponding to the input light signal in accordance with the light power of the input light signal that is received by the electric signal transmission device 104.

When one of the extinction function unit 145 that performs the extinction function, which is stored in the function pair table 1203 as one of the first function pair, and the light power control unit 141 that performs the light power control, which is also stored in the function pair table 1203 as one of the first function pair, performs the function, the other suspends the function. Similarly, when one of the state monitoring unit 142 that performs the state monitoring, which is stored in the function pair table 1203 as one of the second function pair, and the temperature control unit 143 that performs the temperature control, which is also stored in the function pair table 1203 as one of the second function pair, performs the function, the other suspends the function.

The processing state storage unit 15 stores the processing being performed by one of the external interface unit 140 to the received signal threshold value control unit 149 of the processing unit 14. The processing state storage unit 15 sets a processing flag indicating which function module of the external interface unit 140 to the received signal threshold value control unit 149 is performing the processing. For example, the processing state storage unit 15 sets a processing flag indicating that the external interface unit 140 is performing the processing when the external interface unit 140 starts the processing. The processing state storage unit 15 clears the processing flag indicating that the external interface unit 140 is performing the processing when the external interface unit 140 terminates the processing.

(Software Error Correction Processing and Correction Frequency Change Processing by Control Device According to First Embodiment)

Figure 9B:
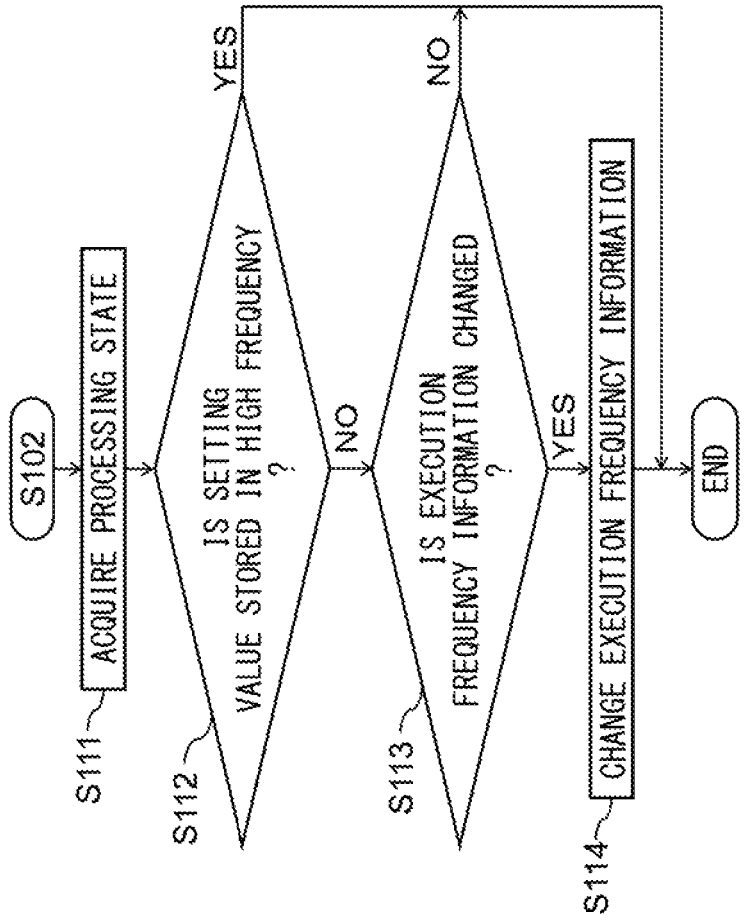
FIG. 9B is a flowchart illustrating more detailed processing of the processing at S102 illustrated in FIG. 9A.
Figure 9A:
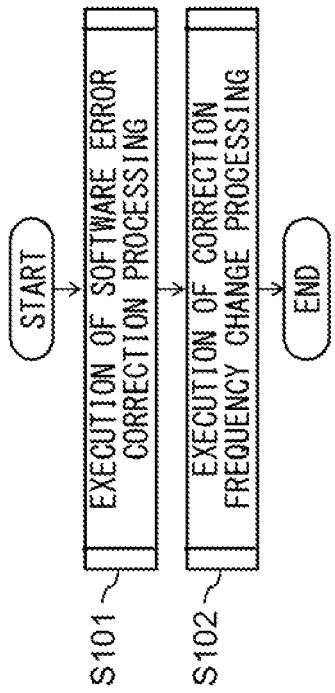
FIG. 9A is a flowchart of software error correction processing and correction frequency change processing by the operation unit illustrated in FIG. 6.

FIG. 9A is a flowchart of software error correction processing and correction frequency change processing by the operation unit 13 and FIG. 9B is a flowchart illustrating more detailed processing of the processing at S102 illustrated in FIG. 9A. The software error correction processing and the correction frequency change processing illustrated in FIG. 9A are performed mainly by the operation unit 13 in cooperation with each element of the control device 1 based on programs stored in advance in the nonvolatile memory 12. The processing illustrated in FIG. 9A is performed every predetermined set time in the operation unit 13. Further, in FIG. 9A, the software error correction processing and the correction frequency change processing are illustrated as a series of processing, but the software error correction processing and the correction frequency change processing may be performed as separate processing.

First, the software error correction unit 16 refers to the error correction information area 120 and performs the software error correction processing (S101). The software error correction processing that is performed by the software error correction unit 16 is the same as the software error correction processing that is performed by the software error correction unit 932 explained with reference to FIG. 4, and therefore a detailed explanation is omitted.

Next, the correction frequency change unit 17 changes the frequency with which the software error correction processing is performed in accordance with the processing that is performed by the processing unit 14 (S102).

First, the correction frequency change unit 17 acquires the processing state of the processing unit 14, which is stored by the processing state storage unit 15 (S111). Next, the correction frequency change unit 17 determines whether the storage area in which the setting value of the processing module is stored, which is stored as being performed by the processing state storage unit 15, is stored in the high frequency in the execution frequency information 1202 (S112). When the correction frequency change unit 17 determines that the storage area in which the setting value of the processing module is stored, which is stored as being performed by the processing state storage unit 15, is stored in the high frequency in the execution frequency information 1202 (S112—YES), the correction frequency change unit 17 terminates the processing.

When the correction frequency change unit 17 determines that the storage area in which the setting value of the processing module is stored, which is stored as being performed, is stored in the low frequency in the execution frequency information 1202 (S112—NO), the correction frequency change unit 17 determines whether to change the execution frequency information 1202 (S113). The correction frequency change unit 17 refers to the function pair table 1203, and determines whether the function module corresponding to the storage area, which is determined to be stored in the low frequency in the execution frequency information 1202, has a function pair and determines whether to change the execution frequency information 1202. When the function module corresponding to the storage area, which is determined to be stored in the low frequency in the execution frequency information 1202, has a function pair, the correction frequency change unit 17 determines to change the execution frequency information 1202. On the other hand, when the function module corresponding to the storage area, which is determined to be stored in the low frequency in the execution frequency information 1202, does not have a function pair, the correction frequency change unit 17 determines not to change the execution frequency information 1202.

When the correction frequency change unit 17 determines not to change the execution frequency information 1202 (S113—NO) because the function module that is being performed and for which the setting value is determined to be stored in the low frequency in the execution frequency information 1202 does not have a function pair, the correction frequency change unit 17 terminates the processing.

When the correction frequency change unit 17 determines to change the execution frequency information 1202 (S113—YES) because the function module that is being performed and for which the setting value is determined to be stored in the low frequency has a function pair, the correction frequency change unit 17 changes the execution frequency information 1202 (S114). The correction frequency change unit 17 changes the storage area in which the setting value of the function module is stored, which is being performed and for which the setting value is determined to be stored in the low frequency, from the low frequency to the high frequency. In addition, the correction frequency change unit 17 changes the storage area in which the setting value of the function module is stored, which is stored as the function pair in the function pair table 1203, from the high frequency to the low frequency.

For example, the correction frequency change unit 17 changes the sixth storage area 116 in which the setting value of the extinction function is stored, which is being performed and for which the setting value is determined to be stored in the low frequency, from the low frequency to the high frequency. In addition, the correction frequency change unit 17 changes the second storage area 112 in which the setting value of the light power control is stored, which is stored as the first function pair along with the extinction function in the function pair table 1203, from the high frequency to the low frequency.

Further, the correction frequency change unit 17 changes the third storage area 113 in which the setting value of the state monitoring is stored, which is being performed and for which the setting value is determined to be stored in the low frequency, from the low frequency to the high frequency. In addition, the correction frequency change unit 17 changes the fourth storage area 114 in which the setting value of the temperature control is stored, which is stored as the second function pair along with the extinction function in the function pair table 1203, from the high frequency to the low frequency.

(Working and Effect of Control Device According to First Embodiment)

The control device according to the first embodiment may change the execution frequency of error correction in accordance with a change in external circumstances after the shipment of the processing device by changing the correction frequency with which the error correction processing, such as the software error correction, is performed in accordance with the processing that is performed by the processing unit.

Further, the control device according to the first embodiment may set, by storing a pair of function modules, one of which suspends when the other is performed, the function error correction processing of the one of the function pair, which is being performed, to the high frequency and the function error correction processing of the other in suspension to the low frequency.

Figure 11B:
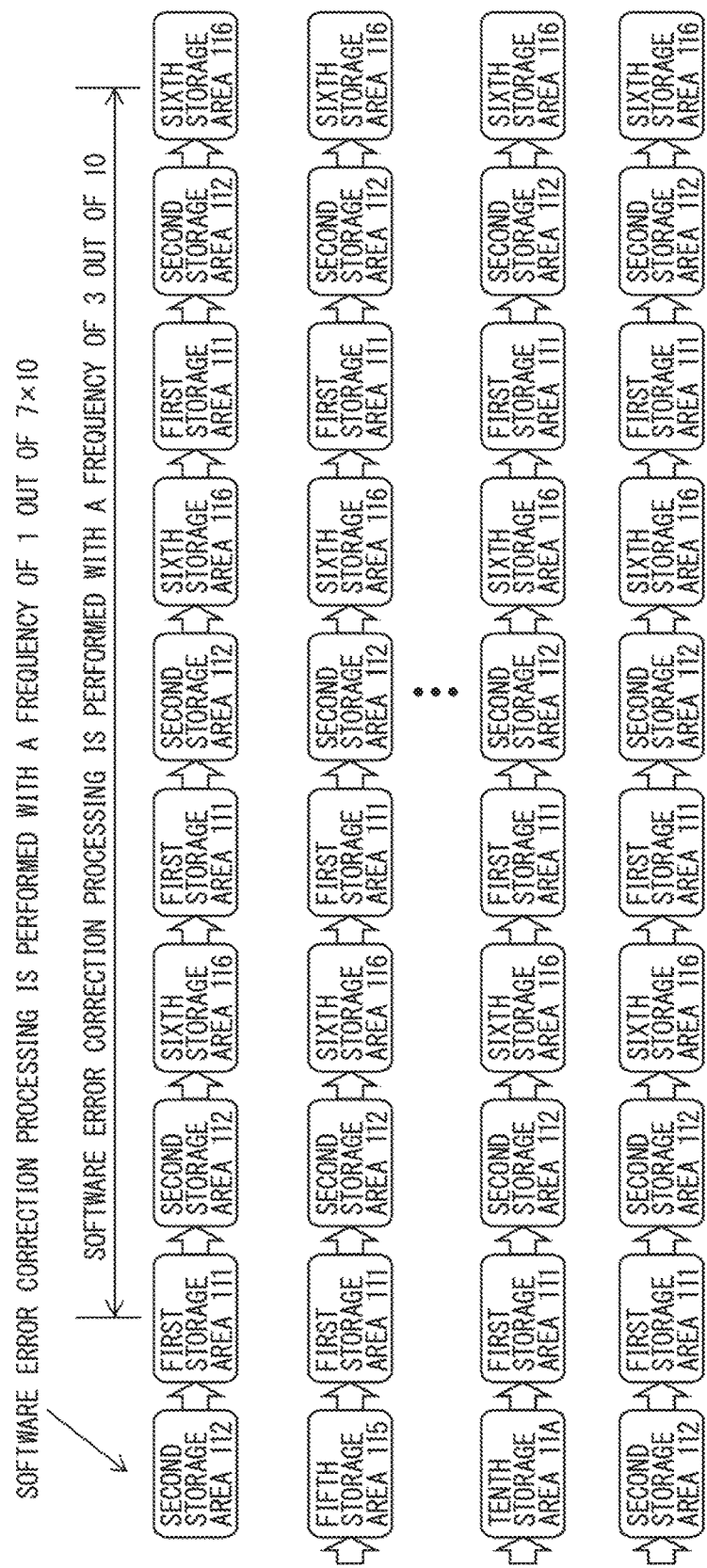
FIG. 11B is a diagram illustrating an example of the execution order of the software error correction processing when the light power control unit is keeping the light power control in suspension and the extinction function unit is performing the extinction function.

FIG. 10A is a diagram illustrating the execution frequency information 1202 when the light power control unit 141 is performing the light power control and the extinction function unit 145 is keeping the extinction function in suspension. FIG. 10B is a diagram illustrating execution frequency information 1202' when the light power control unit 141 is keeping the light power control in suspension and the extinction function unit 145 is performing the extinction function. FIG. 11A is a diagram illustrating an example of the execution order of the software error correction processing when the light power control unit 141 is performing the light power control and the extinction function unit 145 is keeping the extinction function in suspension. FIG. 11B is a diagram illustrating an example of the execution order of the software error correction processing when the light power control unit 141 is keeping the light power control in suspension and the extinction function unit 145 is performing the extinction function.

The control device 1 sets the execution frequency of the software error correction processing of the second storage area 112 that stores the setting value of the light power control to the high frequency when the light power control unit 141 is performing the light power control and the extinction function unit 145 is keeping the extinction function in suspension. In addition, the control device 1 sets the execution frequency of the software error correction processing of the sixth storage area 116 that stores the setting value of the extinction function to the low frequency when the light power control unit 141 is performing the light power control and the extinction function unit 145 is keeping the extinction function in suspension.

The control device 1 performs the software error correction processing of the second storage area 112 that stores the setting value of the power control with a frequency of 3 out of 10, in other words, with a frequency of 1 out of 3.3 when the light power control unit 141 is performing the light power control and the extinction function unit 145 is keeping the extinction function in suspension. On the other hand, the control device 1 performs the software error correction processing of the sixth storage area 116 that stores the setting value of the extinction function with a frequency of 1 out of 70 (=7×10) when the light power control unit 141 is performing the light power control and the extinction function unit 145 is keeping the extinction function in suspension.

The control device 1 sets the execution frequency of the software error correction processing of the second storage area 112 that stores the setting value of the light power control to the low frequency when the light power control unit 141 is keeping the light power control in suspension and the extinction function unit 145 is performing the extinction function. In addition, the control device 1 sets the execution frequency of the software error correction processing of the sixth storage area 116 that stores the setting value of the extinction function to the high frequency when the light power control unit 141 is keeping the light power control in suspension and the extinction function unit 145 is performing the extinction function.

The control device 1 performs the software error correction processing of the second storage area 112 that stores the setting value of the power control with a frequency of 1 out of 70 (=7×10) when the light power control unit 141 is keeping the light power control in suspension and the extinction function unit 145 is performing the extinction function. On the other hand, the control device 1 performs the software error correction processing of the sixth storage area 116 that stores the setting value of the extinction function with a frequency of 1 out of 3.3 when the light power control unit 141 is keeping the light power control in suspension and the extinction function unit 145 is performing the extinction function.

(Configuration and Function of Control Device Installed in Processing Device According to Second Embodiment)

Figure 12:
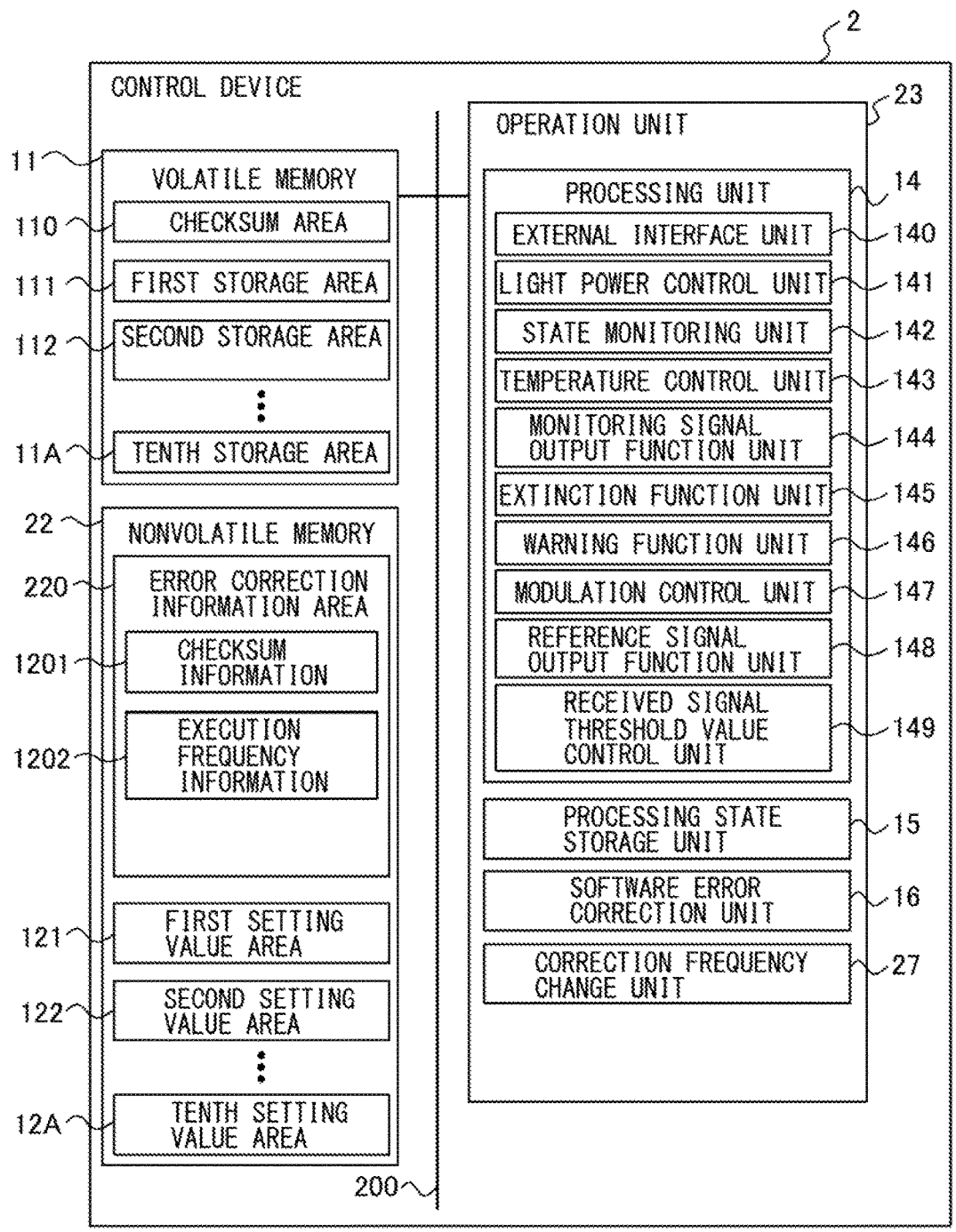
FIG. 12 is a block diagram of a control device that is installed in a processing device according to a second embodiment.

FIG. 12 is a block diagram of a control device that is installed in a processing device according to a second embodiment. The processing device according to the second embodiment has the same configuration as that of the light transmission/reception module 100 except in that a control device 2 is installed instead of the control device 1, and therefore schematic representation and detailed explanation are omitted.

The control device 2 decreases, when the frequency of correction by the error correction unit for the storage area that stores one setting value is changed to a high frequency, the frequency of correction by the error correction processing for one storage area other than the storage area whose correction frequency is changed to a high frequency so as to be lower than the correction frequency of the storage area whose correction frequency is changed to a high frequency. In addition, the control device 2 increases, when the frequency of correction by the error correction unit for the storage area that stores one setting value is changed to a low frequency, the frequency of correction by the error correction processing for one storage area other than the storage area whose correction frequency is changed to a low frequency so as to be higher than the correction frequency of the storage area whose correction frequency is changed to a low frequency.

The control device 2 differs from the control device 1 in having a nonvolatile memory 22 and an operation unit 23 instead of the nonvolatile memory 12 and the operation unit 13. The nonvolatile memory 22 differs from the nonvolatile memory 12 in having an error correction information area 220 instead of the error correction information area 120. The error correction information area 220 differs from the error correction information area 120 in not having the function pair table 1203. The operation unit 23 differs from the operation unit 13 in having a correction frequency change unit 27 instead of the correction frequency change unit 17. The configurations and the functions of the components of the control device 2 other than the error correction information area 220 and the correction frequency change unit 27 are the same as the configurations and the functions of the components of the control device 1, to which the same symbols are attached, and therefore detailed explanation is omitted here.

(Software Error Correction Processing and Correction Frequency Change Processing by Control Device According to Second Embodiment)

Figure 13B:
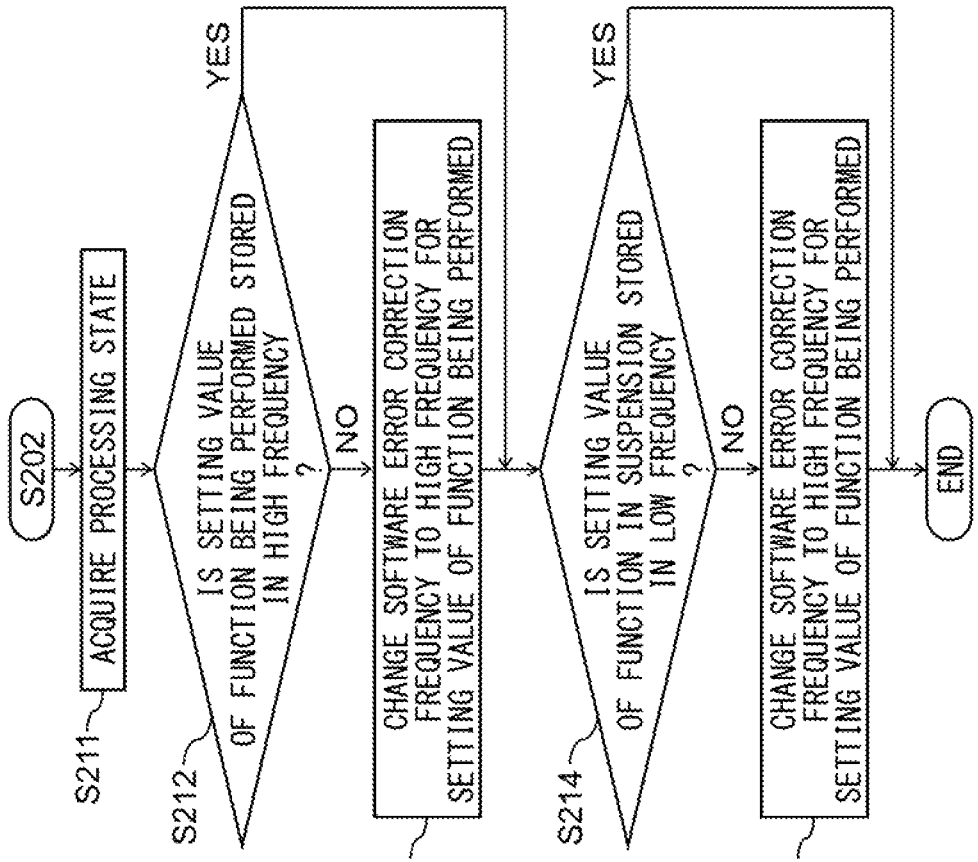
FIG. 13B is a flowchart illustrating more detailed processing of the processing at S202 illustrated in FIG. 13A.
Figure 13A:
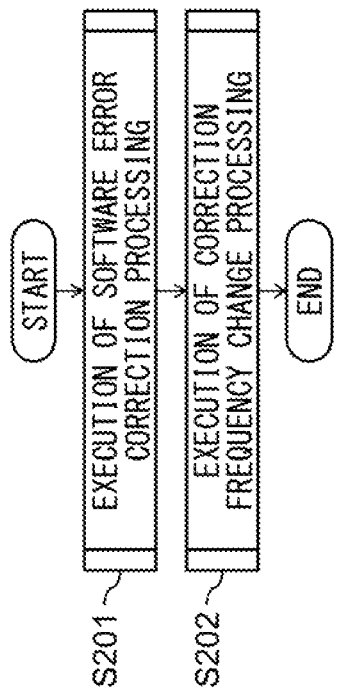
FIG. 13A is a flowchart of software error correction processing and correction frequency change processing by the operation unit illustrated in FIG. 12.

FIG. 13A is a flowchart of software error correction processing and correction frequency change processing by the operation unit 23 and FIG. 13B is a flowchart illustrating more detailed processing of the processing at S202 illustrated in FIG. 13A. The software error correction processing and the correction frequency change processing illustrated in FIG. 13A are performed mainly by the operation unit 23 in cooperation with each element of the control device 2 based on programs stored in advance in the nonvolatile memory 22. The processing illustrated in FIG. 13A is performed every predetermined set time in the operation unit 23. Further, in FIG. 13A, the software error correction processing and the correction frequency change processing are illustrated as a series of processing, but the software error correction processing and the correction frequency change processing may be performed as separate processing.

First, the software error correction unit 16 refers to the error correction information area 220 and performs the software error correction processing (S201). The software error correction processing that is performed by the software error correction unit 16 is the same as the software error correction processing that is performed by the software error correction unit 932 explained with reference to FIG. 4, and therefore detailed explanation is omitted here.

Next, the correction frequency change unit 27 changes the frequency with which the software error correction processing is performed in accordance with the processing that is performed by the processing unit 14 (S202).

First, the correction frequency change unit 27 acquires the processing state of the processing unit 14, which is stored by the processing state storage unit 15 (S211). Next, the correction frequency change unit 27 determines whether the storage area in which the setting value of the processing module is stored, which is stored as being performed by the processing state storage unit 15, is stored in the high frequency in the execution frequency information 1202 (S212). When the correction frequency change unit 27 determines that the storage area in which the setting value of the processing module is stored, which is stored as being performed by the processing state storage unit 15, is stored in the high frequency in the execution frequency information 1202 (S212—YES), the processing advances to step S214.

When the correction frequency change unit 27 determines that the storage area in which the setting value of the processing module is stored, which is stored as being performed, is stored in the low frequency in the execution frequency information 1202 (S212—NO), the correction frequency change unit 27 changes the execution frequency information 1202 (S213). The correction frequency change unit 27 moves the storage area in which the setting value of the processing module is stored, which is stored as being performed, from the low frequency to the high frequency in the execution frequency information 1202.

Next, the correction frequency change unit 27 determines whether the storage area in which the setting value of the processing module is stored, which is stored as being in suspension by the processing state storage unit 15, is stored in the low frequency in the execution frequency information 1202 (S214). When the correction frequency change unit 27 determines that the storage area in which the setting value of the processing module is stored, which is stored as being in suspension by the processing state storage unit 15, is stored in the low frequency in the execution frequency information 1202 (S214—YES), the correction frequency change unit 27 terminates the processing.

When the correction frequency change unit 27 determines that the storage area in which the setting value of the processing module is stored, which is stored as being in suspension, is stored in the high frequency in the execution frequency information 1202 (S214—NO), the correction frequency change unit 27 changes the execution frequency information 1202 (S215). The correction frequency change unit 27 moves the storage area in which the setting value of the processing module is stored, which is stored as being in suspension, from the high frequency to the low frequency in the execution frequency information 1202.

Figure 15B:
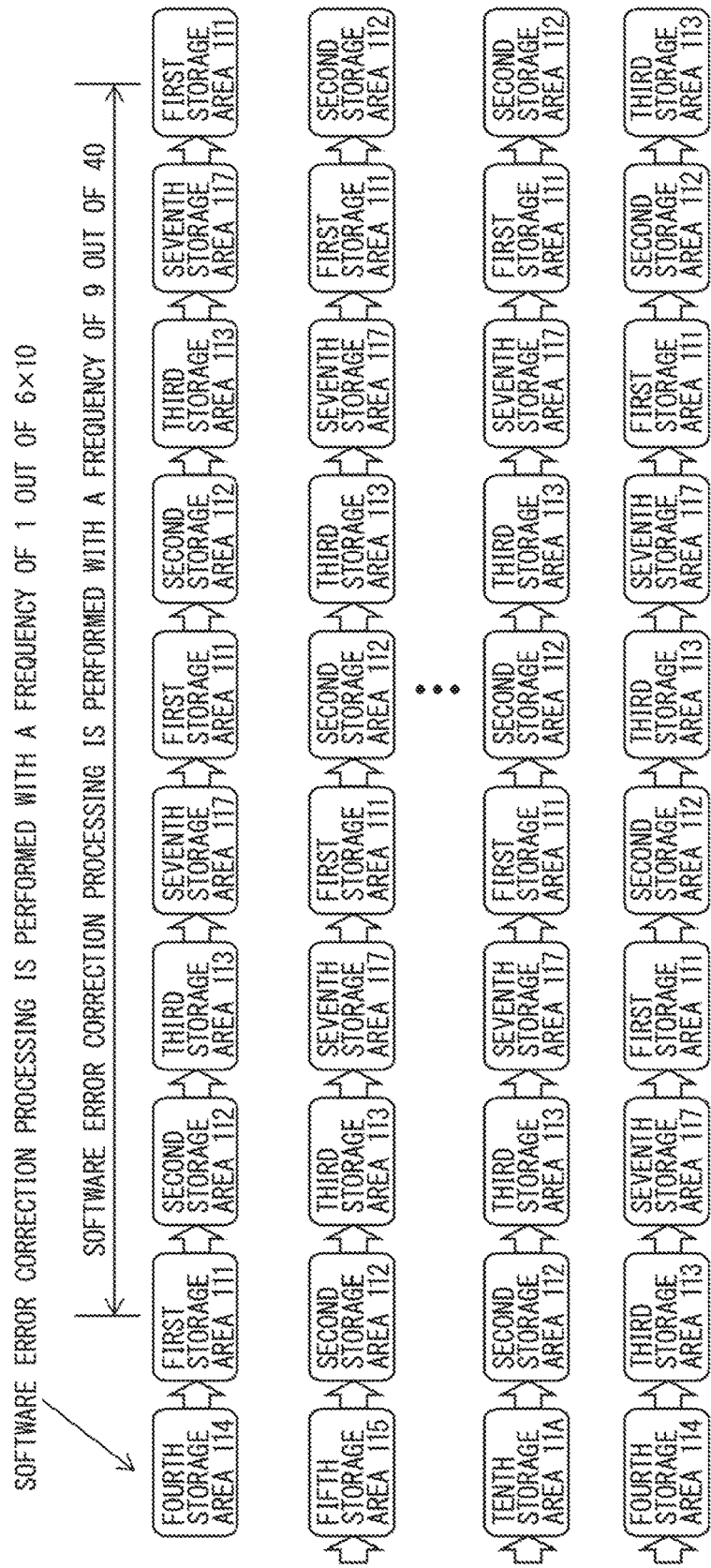
FIG. 15B is a diagram illustrating an example of the execution order of the software error correction processing when the warning function unit is performing the warning function.

FIG. 14A is a diagram illustrating the execution frequency information 1202 when the warning function unit 146 is keeping the warning function in suspension. FIG. 14B is a diagram illustrating execution frequency information 1202" when the warning function unit 146 is performing the warning function when temperature of the control device 2 is risen and the like. FIG. 15A is a diagram illustrating an example of the execution order of the software error correction processing when the warning function unit 146 is keeping the warning function in suspension. FIG. 15B is a diagram illustrating an example of the execution order of the software error correction processing when the warning function unit 146 is performing the warning function.

The control device 2 sets, when the warning function unit 146 is keeping the warning function in suspension, the execution frequency of the software error correction processing of the seventh storage area 117 that stores the setting value of the warning function to the low frequency. On the other hand, the control device 2 sets, when the warning function unit 146 is performing the warning function, the execution frequency of the software error correction processing of the seventh storage area 117 that stores the setting value of the warning function to the high frequency.

The control device 2 performs, when the warning function unit 146 is performing the warning function, the software error correction processing of the seventh storage area 117 that stores the setting value of the warning function with a frequency of 9 out of 40, in other words, a frequency of 1 out of 4.4. On the other hand, the control device 2 performs, when the warning function unit 146 is keeping the warning function in suspension, the software error correction processing of the seventh storage area 117 that stores the setting value of the warning function with a frequency of 1 out of 70 (=7×10).

The control device 2 changes, in response to the warning function unit 146 starting the warning function, the execution frequency of the software error correction processing of the seventh storage area 117 that stores the setting value of the warning function from the low frequency to the high frequency. In response to the execution frequency of the software error correction processing of the seventh storage area 117 being changed from the low frequency to the high frequency, the execution frequency of the software error correction processing of the first storage area 111 to the third storage area 113 that are classified into the high frequency decreases uniformly from a frequency of 1 out of 3.3 to a frequency of 1 out of 4.4.

The control device 2 changes, in response to the warning function unit 146 suspending the warning function, the execution frequency of the software error correction processing of the seventh storage area 117 that stores the setting value of the warning function from the high frequency to the low frequency. In response to the execution frequency of the software error correction processing of the seventh storage area 117 being changed from the high frequency to the low frequency, the execution frequency of the software error correction processing of the first storage area 111 to the third storage area 113 that are classified into the high frequency increases uniformly from a frequency of 1 out of 4.4 to a frequency of 1 out of 3.3.

(Working and Effect of Control Device According to Second Embodiment)

The control device according to the second embodiment may change the execution frequency of error correction in accordance with a change in external circumstances after the shipment of the processing device by changing the correction frequency with which the error correction processing, such as the software error correction, is performed in accordance with the processing that is performed by the processing unit.

The control device according to the second embodiment uniformly decreases the execution frequency of the error correction processing of a function module classified into the high frequency by changing the execution frequency of the error correction processing of the function module from the low frequency to the high frequency in response to the function module starting the processing. Further, the control device according to the second embodiment uniformly increases the execution frequency of the error correction processing of a function module classified into the low frequency by changing the execution frequency of the error correction processing of the function module from the low frequency to the high frequency in response to the function module starting the processing.

The control device according to the second embodiment uniformly increases the execution frequency of the error correction processing of a function module classified into the high frequency by changing the execution frequency of the error correction processing of the function module from the high frequency to the low frequency in response to the function module suspending the processing. Further, the control device according to the second embodiment uniformly decreases the execution frequency of the error correction processing of a function module classified into the low frequency by changing the execution frequency of the error correction processing of the function module from the high frequency to the low frequency in response to the function module suspending the processing.

(Configuration and Function of Control Device Installed in Processing Device According to Third Embodiment)

Figure 16:
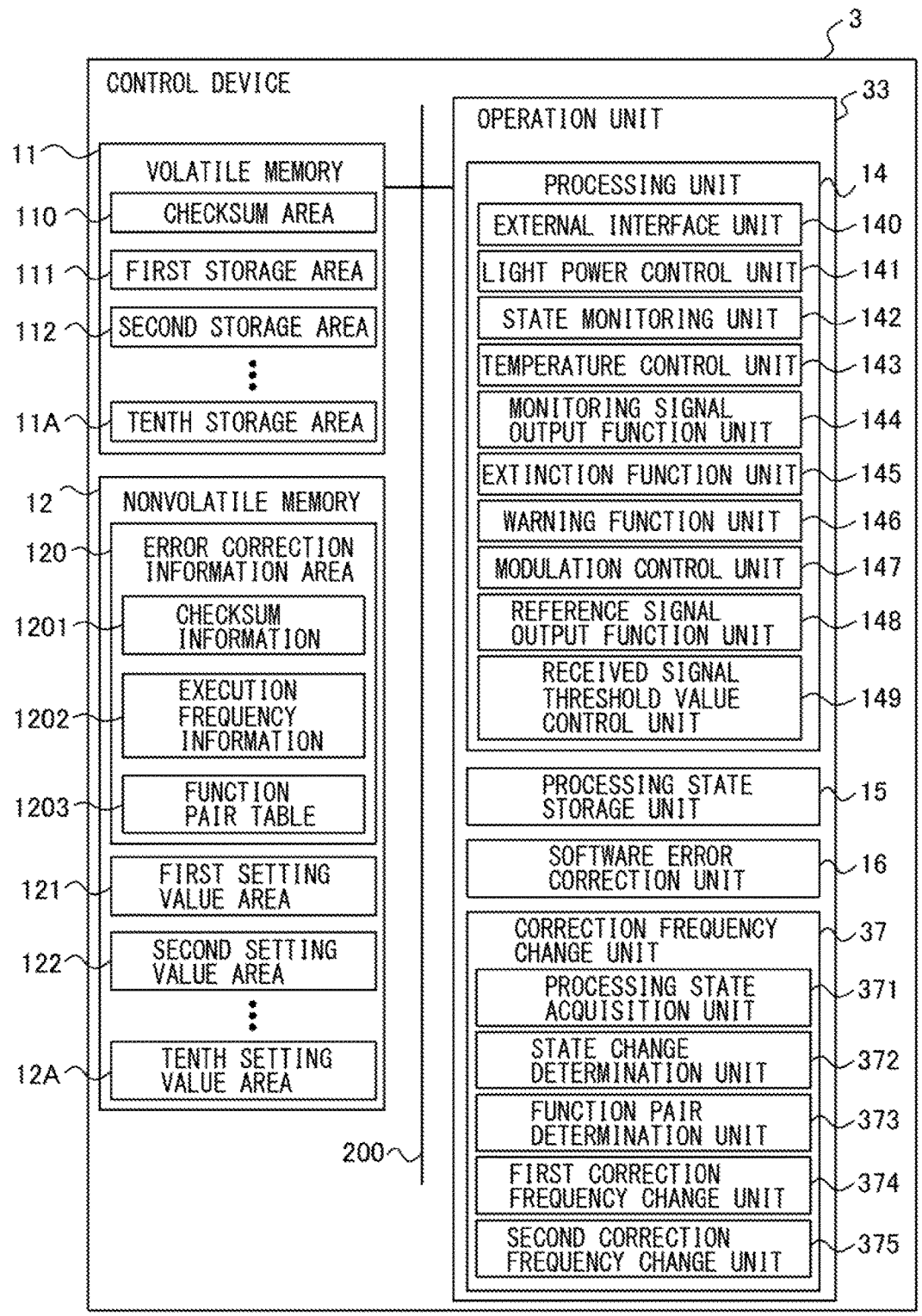
FIG. 16 is a block diagram of a control device that is installed in a processing device according to a third embodiment.

FIG. 16 is a block diagram of a control device that is installed in a processing device according to a third embodiment. The processing device according to the third embodiment has the same configuration as that of the light transmission/reception module 100 except in that a control device 3 is installed instead of the control device 1, and therefore schematic representation and detailed explanation are omitted.

The control device 3 changes processing to change execution frequency information in accordance with whether a function module whose operating state has changed has a function module that is stored in the function pair table and which makes a function pair. The control device 3 exchanges, when there is a function module that makes a function pair with the function module whose operating state has changed, the high frequency and the low frequency between the function module whose operating state has changed and the function module that makes a function pair as the control device 1 does. When there is not a function module that makes a function pair with the function module whose operating state has changed, the control device 3 moves only the function module whose operating state has changed between the high frequency and the low frequency as the control device 2 does.

The control device 3 differs from the control device 1 in having an operation unit 33 instead of the operation unit 13. The operation unit 33 differs from the operation unit 13 in having a correction frequency change unit 37 instead of the correction frequency change unit 17. The configurations and the functions of the components of the control device 3 other than the correction frequency change unit 37 are the same as the configurations and the functions of the components of the control device 1, to which the same symbols are attached, and therefore detailed explanation is omitted here. The correction frequency change unit 37 has a processing state acquisition unit 371, a processing state determination unit 372, a function pair determination unit 373, a first correction frequency change unit 374, and a second correction frequency change unit 375.

(Software Error Correction Processing and Correction Frequency Change Processing by Control Device According to Third Embodiment)

Figures 17A, 17B:
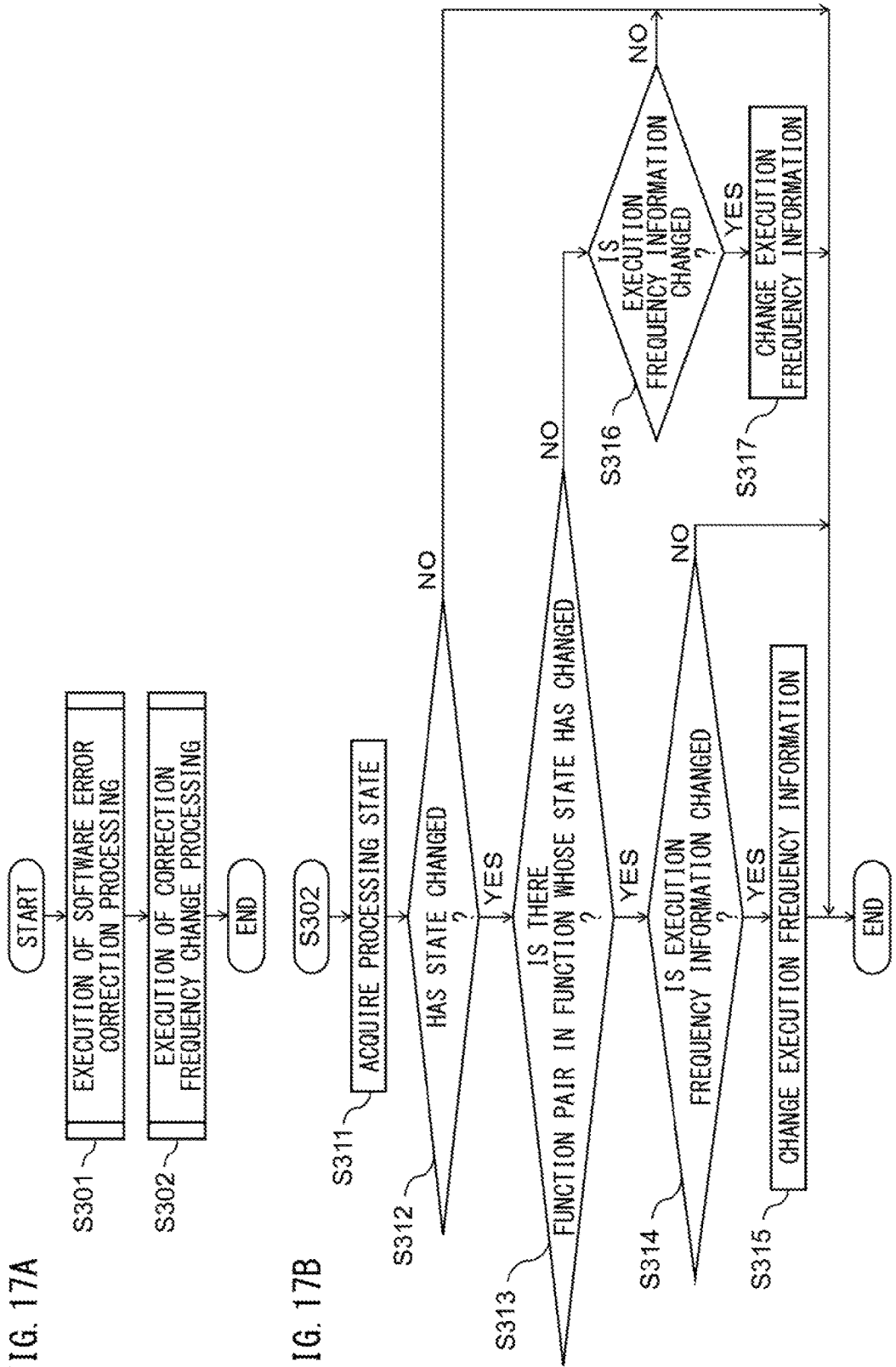
FIG. 17A is a flowchart of software error correction processing and correction frequency change processing by the operation unit illustrated in FIG. 16.
FIG. 17B is a flowchart illustrating more detailed processing of the processing at S302 illustrated in FIG. 17A.

FIG. 17A is a flowchart of software error correction processing and correction frequency change processing by the operation unit 33 and FIG. 17B is a flowchart illustrating more detailed processing of the processing at S302 illustrated in FIG. 17A. The software error correction processing and the correction frequency change processing illustrated in FIG. 17A are performed mainly by the operation unit 33 in cooperation with each element of the control device 3 based on programs stored in advance in the nonvolatile memory 12. The processing illustrated in FIG. 17A is performed every predetermined set time in the operation unit 33. Further, in FIG. 17A, the software error correction processing and the correction frequency change processing are illustrated as a series of processing, but the software error correction processing and the correction frequency change processing may be performed as separate processing.

First, the software error correction unit 16 refers to the error correction information area 220 and performs the software error correction processing (S301). The software error correction processing that is performed by the software error correction unit 16 is the same as the software error correction processing that is performed by the software error correction unit 932 explained with reference to FIG. 4, and therefore detailed explanation is omitted here.

Next, the correction frequency change unit 37 changes the frequency with which the software error correction processing is performed in accordance with the processing that is performed by the processing unit 14 (S302).

First, the processing state acquisition unit 371 acquires the processing state of the processing unit 14, which is stored by the processing state storage unit 15 (S311). Next, the processing state determination unit 372 determines whether the operating state of the function module has changed between the processing state acquired by the processing state acquisition unit 371 the previous time and the processing state acquired by the processing state acquisition unit 371 this time (S312). When the processing state determination unit 372 determines that the operating state of the function module has not changed (S312—NO), the processing terminates.

When the processing state determination unit 372 determines that the operating state of the function module has changed (S312—YES), the function pair determination unit 373 determines whether the function module whose state has changed has a function pair (S313).

When the function pair determination unit 373 determines that there is a function pair in the function module whose state has changed (S313—YES), the first correction frequency change unit 374 determines whether to change the execution frequency information (S314). The first correction frequency change unit 374 determines not to change the execution frequency information when the function module has changed from the suspension state into the operating state and when the storage area in which the setting value of the function module is stored is stored in the high frequency in the execution frequency information 1202. Further, the first correction frequency change unit 374 determines not to change the execution frequency information when the function module has changed from the operating state into the suspension state and when the storage area in which the setting value of the function module is stored is stored in the low frequency in the execution frequency information 1202. When the first correction frequency change unit 374 determines not to change the execution frequency information (S314—NO), the processing terminates.

On the other hand, the first correction frequency change unit 374 determines to change the execution frequency information when the function module has changed from the suspension state into the operating state and when the storage area in which the setting value of the function module is stored is stored in the low frequency in the execution frequency information 1202. Further, the first correction frequency change unit 374 determines to change the execution frequency information when the function module has changed from the operating state into the suspension state and when the storage area in which the setting value of the function module is stored is stored in the high frequency in the execution frequency information 1202. When the first correction frequency change unit 374 determines not to change the execution frequency information (S314—YES), the first correction frequency change unit 374 changes the function module whose state has changed and the function module that is the function pair of the function module from the high frequency to the low frequency or from the low frequency to the high frequency (S315).

When the function pair determination unit 373 determines that there is not a function pair in the function module whose state has changed (S313—NO), the second correction frequency change unit 375 determines whether to change the execution frequency information (S316). The second correction frequency change unit 375 determines not to change the execution frequency information when the function module has changed from the suspension state into the operating state and when the storage area in which the setting value of the function module is stored is stored in the high frequency in the execution frequency information 1202. Further, the second correction frequency change unit 375 determines not to change the execution frequency information when the function module has changed from the operating state into the suspension state and when the storage area in which the setting value of the function module is stored is stored in the low frequency in the execution frequency information 1202. When the second correction frequency change unit 375 determines not to change the execution frequency information (S316—NO), the processing terminates.

On the other hand, the second correction frequency change unit 375 determines to change the execution frequency information when the function module has changed from the suspension state into the operating state and when the storage area in which the setting value of the function module is stored is stored in the low frequency in the execution frequency information 1202. Further, the second correction frequency change unit 375 determines to change the execution frequency information when the function module has changed from the operating state into the suspension state and when the storage area in which the setting value of the function module is stored is stored in the high frequency in the execution frequency information 1202. When the second correction frequency change unit 375 determines not to change the execution frequency information (S316—YES), the second correction frequency change unit 375 changes the function module whose state has changed from the high frequency to the low frequency or from the low frequency to the high frequency (S317).

(Working and Effect of Control Device According to Third Embodiment)

The control device according to the third embodiment may change the execution frequency information more appropriately in accordance with a function module by changing a change method of the execution frequency information in accordance with whether a function module whose operating state has changed has a function pair.

(Configuration and Function of Control Device Installed in Processing Device According to Fourth Embodiment)

Figure 18:
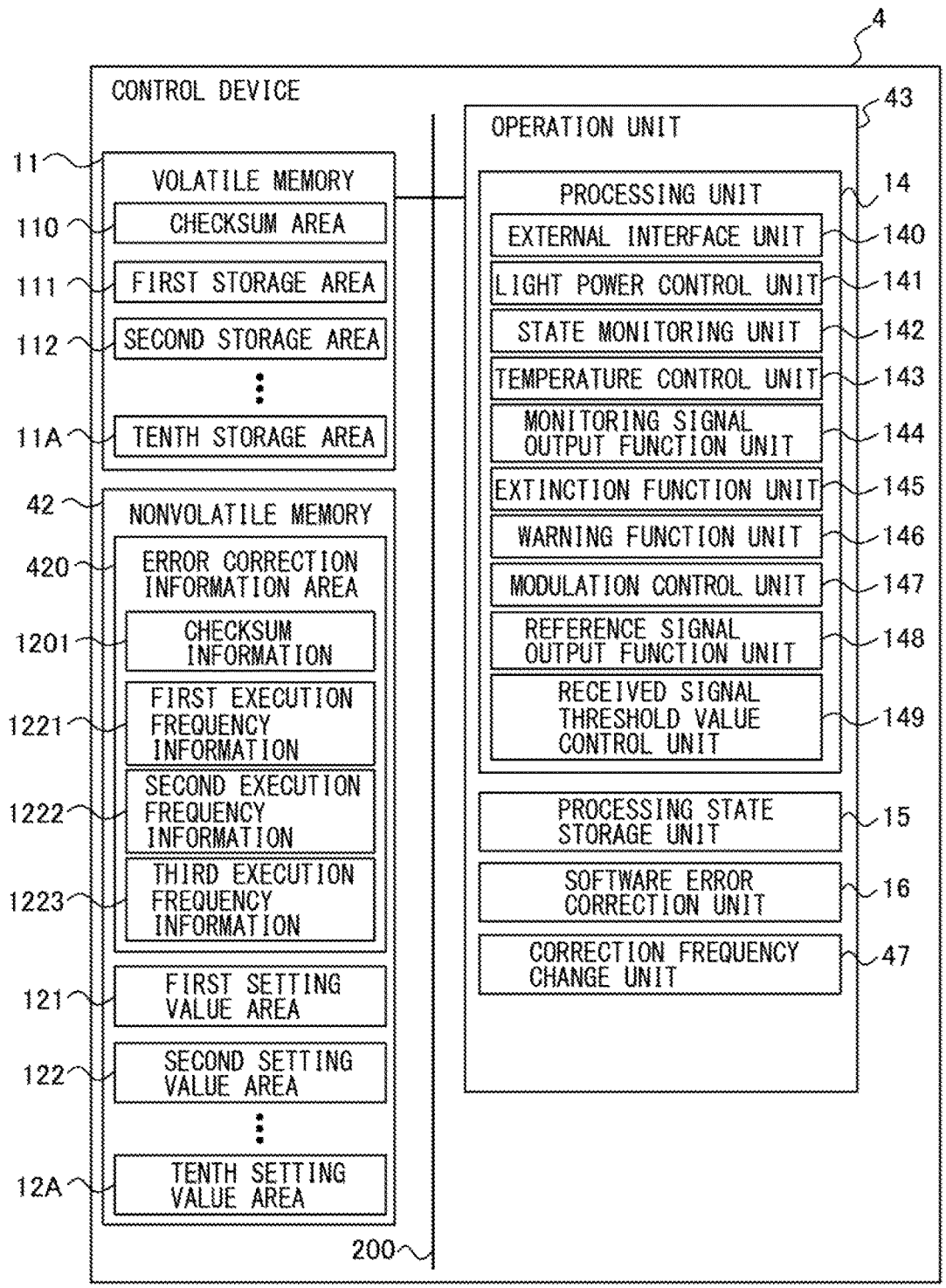
FIG. 18 is a flock diagram of a control device that is installed in a processing device according to a fourth embodiment.

FIG. 18 is a flock diagram of a control device that is installed in a processing device according to a fourth embodiment. The processing device according to the fourth embodiment has the same configuration as that of the light transmission/reception module 100 except in that a control device 4 is installed instead of the control device 1, and therefore schematic representation and detailed explanation are omitted.

Figure 19:
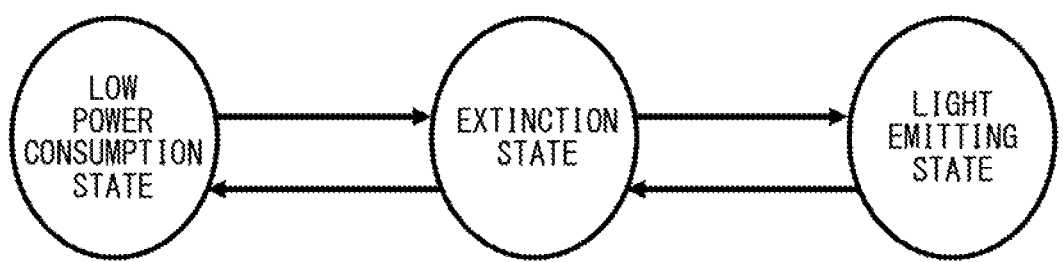
FIG. 19 is diagram illustrating three states including a low power consumption state, an extinction state, and a light emitting state.

The control device 4 changes an execution frequency of error correction in accordance with the state of the light transmission/reception module 100. The light transmission/reception module 100 operates in three states illustrated in FIG. 19, including a low power consumption state, an extinction state, and a light emitting state. The low power consumption state is a state where the light transmission/reception module 100 does not in the least transmit or receive an electric signal and a light signal and the extinction state is a state where the light transmission/reception module 100 transmits and receives only an electric signal and does not in the least transmit or receive a light signal. The light emitting state is a state where the light transmission/reception module 100 transmits and receives both an electric signal and a light signal.

The control device 4 differs from the control device 1 in having a nonvolatile memory 42 and an operation unit 43 instead of the nonvolatile memory 12 and the operation unit 13. The nonvolatile memory 42 differs from the nonvolatile memory 12 in having an error correction information area 420 instead of the error correction information area 120. The operation unit 43 differs from the operation unit 13 in having a correction frequency change unit 47 instead of the correction frequency change unit 17. The configurations and the functions of the components of the control device 4 other than the error correction information area 420 and the correction frequency change unit 47 are the same as the configurations and the functions of the components of the control device 1, to which the same symbols are attached, and therefore detailed explanation is omitted here.

The error correction information area 420 stores the checksum information 1201, first execution frequency information 1221, second execution frequency information 1222, and third execution frequency information 1223. The checksum information 1201 includes the original data of the checksum corresponding to each of the first storage area 111 to the tenth storage area 11A, which is stored in the checksum area 110. The first execution frequency information 1221 is used when the light transmission/reception module 100 is in the low power consumption state and the second execution frequency information 1222 is used when the light transmission/reception module 100 is in the extinction state. The third execution frequency information 1223 is used when the light transmission/reception module 100 is in the light emitting state.

FIG. 20A is a diagram illustrating the first execution frequency information 1221, FIG. 20B is a diagram illustrating the second execution frequency information 1222, and FIG. 20C is a diagram illustrating the third execution frequency information 1223.

The first execution frequency information 1221 that is used in the low power consumption state sets the first storage area 111 that stores the setting value of the external interface unit 140 and the seventh storage area 117 that stores the setting value of the warning function unit 146 to the high frequency and sets the other storage areas to the low frequency. The second execution frequency information 1222 that is used in the extinction state sets the tenth storage area 11A that stores the setting value of the received signal threshold value control unit 149 to the high frequency, in addition to the first storage area 111 and the seventh storage area 117, and sets the other storage areas to the low frequency. The third execution frequency information 1223 that is used in the light emitting state sets the first storage area 111 to the third storage area 113 to the high frequency and sets the other storage areas to the low frequency.

(Software Error Correction Processing and Correction Frequency Change Processing by Control Device According to Fourth Embodiment)

Figure 21B:
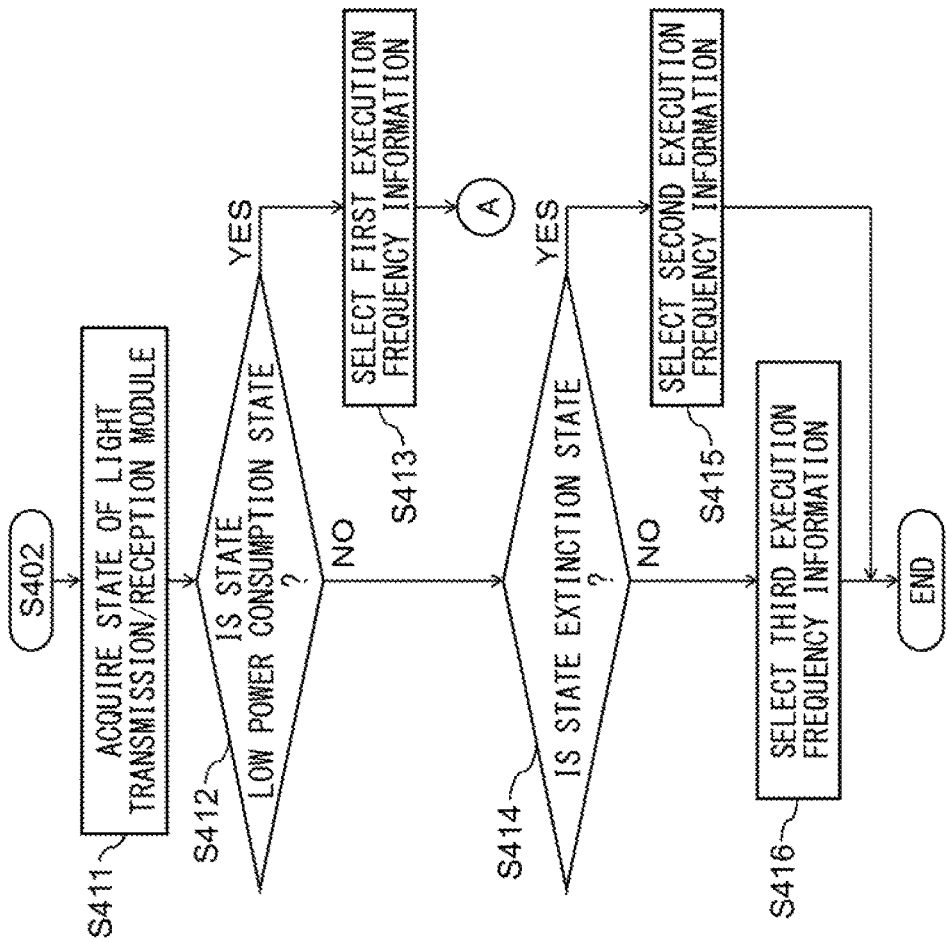
FIG. 21B is a flowchart illustrating more detailed processing of the processing at S402 illustrated in FIG. 21A.
Figure 21A:
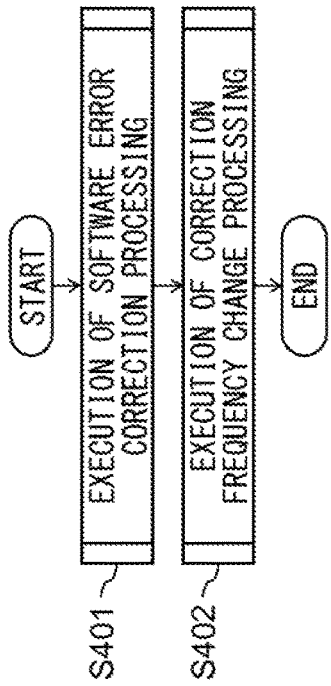
FIG. 21A is a flowchart of software error correction processing and correction frequency change processing by the operation unit illustrated in FIG. 18.

FIG. 21A is a flowchart of software error correction processing and correction frequency change processing by the operation unit 43 and FIG. 21B is a flowchart illustrating more detailed processing of the processing at S402 illustrated in FIG. 21A. The software error correction processing and the correction frequency change processing illustrated in FIG. 21A are performed mainly by the operation unit 43 in cooperation with each element of the control device 4 based on programs stored in advance in the nonvolatile memory 42. The processing illustrated in FIG. 21A is performed every predetermined set time in the operation unit 43. Further, in FIG. 21A, the software error correction processing and the correction frequency change processing are illustrated as a series of processing, but the software error correction processing and the correction frequency change processing may be performed as separate processing.

First, the software error correction unit 16 refers to the error correction information area 420 and performs the software error correction processing (S401). The software error correction processing that is performed by the software error correction unit 16 is the same as the software error correction processing that is performed by the software error correction unit 932 explained with reference to FIG. 4, and therefore detailed explanation is omitted here.

Next, the correction frequency change unit 47 changes the frequency with which the software error correction processing is performed in accordance with the state of the light transmission/reception module 100 (S402).

First, the correction frequency change unit 47 acquires the state of the light transmission/reception module 100 (S411). Next, the correction frequency change unit 47 determines whether the state of the light transmission/reception module 100 is the low power consumption state (S412). The correction frequency change unit 47 determines that the state is the low power consumption state when the received signal threshold value control unit 149 is in suspension and determines that the state is not the low power consumption state when the received signal threshold value control unit 149 is in operation. When the correction frequency change unit 47 determines that the state of the light transmission/reception module 100 is the low power consumption state (S412—YES), the correction frequency change unit 47 selects the first execution frequency information 1221 as the execution frequency information that is used (S413).

When the correction frequency change unit 47 determines that the state of the light transmission/reception module 100 is not the low power consumption state (S412—NO), the correction frequency change unit 47 determines whether the state of the light transmission/reception module 100 is the extinction state (S414). The correction frequency change unit 47 determines that the state is the extinction state when the light power control unit 141 is in suspension and determines that the state is not the extinction state when the light power control unit 141 is in operation. When the correction frequency change unit 47 determines that the state of the light transmission/reception module 100 is the extinction state (S414—YES), the correction frequency change unit 47 selects the second execution frequency information 1222 as the execution frequency information that is used (S415). When the correction frequency change unit 47 determines that the state of the light transmission/reception module 100 is not the extinction state (S414—NO), the correction frequency change unit 47 selects the third execution frequency information 1223 as the execution frequency information that is used (S416).

(Working and Effect of Control Device According to Fourth Embodiment)

The control device according to the fourth embodiment may change the execution frequency of error correction in accordance with a change in external circumstances after the shipment of the processing device by changing the correction frequency with which the error correction processing, such as the software error correction, is performed in accordance with the state of the light transmission/reception module 100.

(Modification Example of Control Device of Embodiment)

The control devices 1 to 4 are installed in the light transmission/reception module 100, but the control devices of the embodiments may be installed in a processing device that performs predetermined processing other than the light transmission/reception module 100. Further, the control devices 1 to 4 perform the software error correction processing, but the control devices of the embodiments may have a configuration in which a bit error resulting from a hardware failure is detected. Furthermore, the control devices 1 to 4 perform the error correction by overwriting the data stored in the nonvolatile memory to the data stored in the volatile memory, but the control devices of the embodiments may perform the error correction by error detection and correction (ECC).

The control devices 1 to 4 specify the execution frequency information by dividing the storage area into the two frequencies, the low frequency and the high frequency, but the control devices of the embodiments may specify the execution frequency information by dividing the storage area into three frequencies, a low frequency, a middle frequency, and a high frequency. Further, the control devices of the embodiments may specify the execution frequency information by dividing the storage area into four or more frequencies.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A processing device comprising:
   a processor; and
   a memory including a plurality of storage areas each storing a setting value for a plurality of functions, wherein the processor
   performs predetermined processing by using each of the setting values;
   performs error correction processing to correct an error of each of the setting values stored in the memory; and
   performs a correction frequency change processing to change a correction frequency with which the error correction processing is performed in accordance with control processing that is performed by the processor, wherein
   the processor performs a first correction frequency change processing to decrease, when a frequency of correction by the error correction processing for a storage area that stores one of the setting values is changed to a high frequency, a frequency of correction by the error correction processing for one of the storage areas other than the storage area whose correction frequency is changed to a high frequency so as to be lower than the correction frequency of the storage area whose correction frequency is changed to a high frequency, and to increase, when a frequency of correction by the error correction processing for a storage area that stores one of the setting values is changed to a low frequency, a frequency of correction by the error correction processing for one of the storage areas other than the storage area whose correction frequency is changed to a low frequency so as to be higher than the correction frequency of the storage area whose correction frequency is changed to a low frequency.

2. The processing device according to claim 1, wherein the processor further performs:

a second correction frequency change processing to uniformly decrease, when a frequency of correction by the error correction processing for a storage area that stores one of the setting values is changed to a high frequency, a frequency of the error correction processing for at least part of the plurality of storage areas other than the storage area whose correction frequency is changed to a high frequency by a predetermined frequency, and to uniformly increase, when a frequency of correction by the error correction processing for a storage area that stores one of the setting values is changed to a low frequency, a frequency of the error correction processing for at least part of the plurality of storage areas other than the storage area whose correction frequency is changed to a low frequency by a predetermined frequency; and a function pair determination processing to cause correction frequency change processing by the first correction frequency change unit to be performed in a case where there is a setting value that is used for second processing that suspends processing when first processing that uses the one setting value is performed, and to cause correction frequency change processing by the second correction frequency change processing to be performed in a case where there is not a setting value that is used for the second processing.

3. A processing device comprising:

a processor; and a memory including a plurality of storage areas each storing a setting value for a plurality of functions, wherein the processor performs predetermined processing by using each of the setting values;

performs error correction processing to correct an error of each of the setting values stored in the memory; and performs a correction frequency change processing to change a correction frequency with which the error correction processing is performed in accordance with control processing that is performed by the processor, wherein the processing performs a second correction frequency change processing to uniformly decrease, when a frequency of correction by the error correction processing for a storage area that stores one of the setting values is changed to a high frequency, a frequency of the error correction processing for at least part of the plurality of storage areas other than the storage area whose correction frequency is changed to a high frequency by a predetermined frequency, and to uniformly increase, when a frequency of correction by the error correction processing for a storage area that stores one of the setting values is changed to a low frequency, a frequency of the error correction processing for at least part of the plurality of storage areas other than the storage area whose correction frequency is changed to a low frequency by a predetermined frequency.

4. The processing device according to claim 3, wherein the processor further performs:

a first correction frequency change processing to decrease, when a frequency of correction by the error correction processing for a storage area that stores one of the setting values is changed to a high frequency, a frequency of correction by the error correction processing for one of the storage areas other than the storage area whose correction frequency is changed to a high frequency so as to be lower than the correction frequency of the storage area whose correction frequency is changed to a high frequency, and to increase, when a frequency of correction by the error correction processing for a storage area that stores one of the setting values is changed to a low frequency, a frequency of correction by the error correction processing for one of the storage areas other than the storage area whose correction frequency is changed to a low frequency so as to be higher than the correction frequency of the storage area whose correction frequency is changed to a low frequency; and a function pair determination processing to cause correction frequency change processing by the first correction frequency change processing to be performed in a case where there is a setting value that is used for second processing that suspends processing when first processing that uses the one setting value is performed, and to cause correction frequency change processing by the second correction frequency change processing to be performed in a case where there is not a setting value that is used for the second processing.

* * * * *